(12) United States Patent
Tanaka

(10) Patent No.: US 10,535,825 B2
(45) Date of Patent: Jan. 14, 2020

(54) FLEXIBLE DISPLAY

(71) Applicant: Sharp Kabushiki Kaisha, Sakai, Osaka (JP)

(72) Inventor: Tetsunori Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 93 days.

(21) Appl. No.: 16/064,126

(22) PCT Filed: Jan. 24, 2017

(86) PCT No.: PCT/JP2017/002378
§ 371 (c)(1),
(2) Date: Jun. 20, 2018

(87) PCT Pub. No.: WO2018/138779
PCT Pub. Date: Aug. 2, 2018

(65) Prior Publication Data
US 2019/0363266 A1    Nov. 28, 2019

(51) Int. Cl.
*H01L 51/00* (2006.01)
*H01L 27/32* (2006.01)
*H01L 51/56* (2006.01)
*H01L 51/52* (2006.01)

(52) U.S. Cl.
CPC ........ *H01L 51/0097* (2013.01); *H01L 27/322* (2013.01); *H01L 27/3276* (2013.01); *H01L 51/003* (2013.01); *H01L 51/5253* (2013.01); *H01L 51/56* (2013.01); *H01L 2227/326* (2013.01); *H01L 2251/5338* (2013.01); *H01L 2251/566* (2013.01)

(58) Field of Classification Search
CPC ............ H01L 27/1225; H01L 27/1248; H01L 27/3248; H01L 27/1259; H01L 27/3288; H01L 51/0097
See application file for complete search history.

(56) References Cited

U.S. PATENT DOCUMENTS

| 2008/0002079 A1* | 1/2008 | Kimura ............... G02B 6/0051 349/42 |
| 2014/0152646 A1 | 6/2014 | Kang et al. |
| 2014/0285992 A1 | 9/2014 | Yang et al. |
| 2015/0028328 A1 | 1/2015 | Ikeda et al. |

(Continued)

FOREIGN PATENT DOCUMENTS

| JP | 2006-004650 A | 1/2006 |
| JP | 2014-182306 A | 9/2014 |

(Continued)

OTHER PUBLICATIONS

Official Communication issued in International Patent Application No. PCT/JP2017/002378, dated Apr. 18, 2017.

*Primary Examiner* — Zandra V Smith
*Assistant Examiner* — John M Parker
(74) *Attorney, Agent, or Firm* — Keating & Bennett, LLP

(57) ABSTRACT

Provided is a flexible display that can be folded in multiple directions. The flexible display is flexible and includes multiple bending sections extended in directions intersecting with each other. The multiple bending sections are each formed to connect different end portions of the flexible display, and a through hole is provided at a fold center portion where the bending sections intersect with each other.

20 Claims, 20 Drawing Sheets

(56) References Cited

U.S. PATENT DOCUMENTS

| | | | |
|---|---|---|---|
| 2015/0035777 A1 | 2/2015 | Hirakata et al. | |
| 2015/0109544 A1 | 4/2015 | Yeo et al. | |
| 2016/0202515 A1 | 7/2016 | Watanabe et al. | |
| 2017/0288168 A1* | 10/2017 | Kim | H01L 51/5253 |
| 2019/0081127 A1* | 3/2019 | Shim | H01L 27/3276 |

FOREIGN PATENT DOCUMENTS

| | | |
|---|---|---|
| JP | 2015-043081 A | 3/2015 |
| JP | 2015-045846 A | 3/2015 |
| WO | 2015/029704 A1 | 3/2015 |

\* cited by examiner

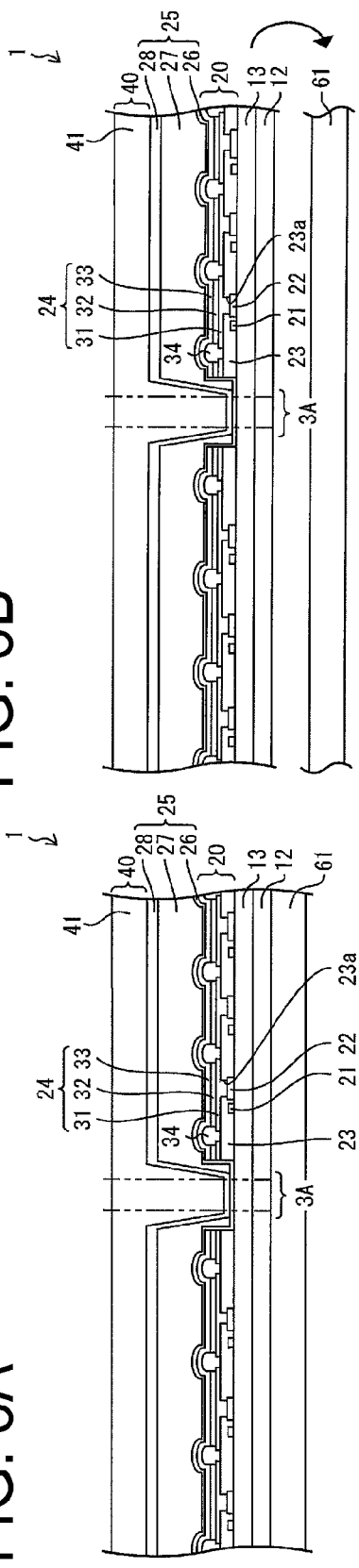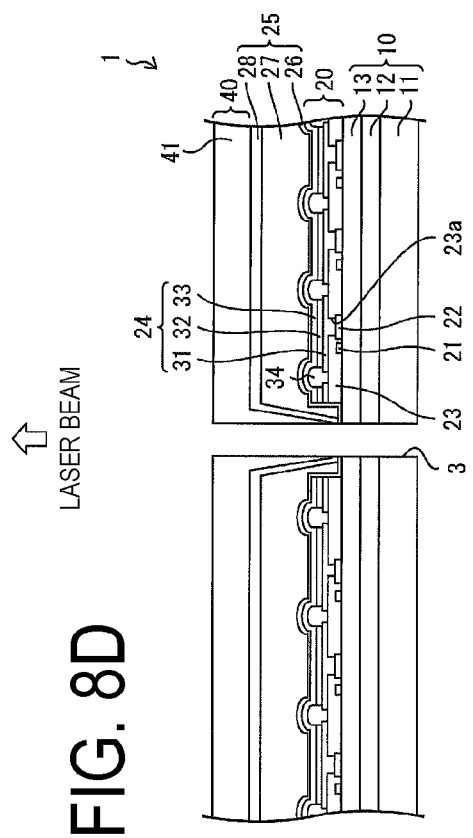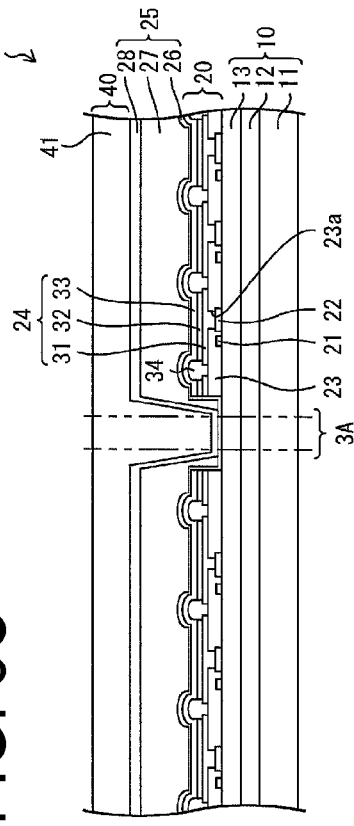

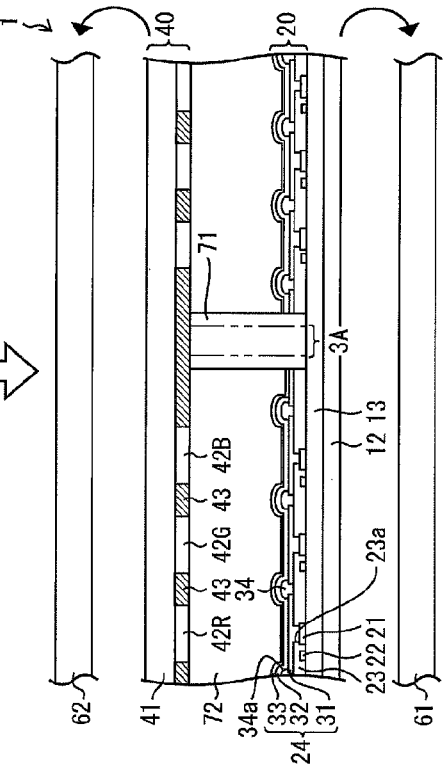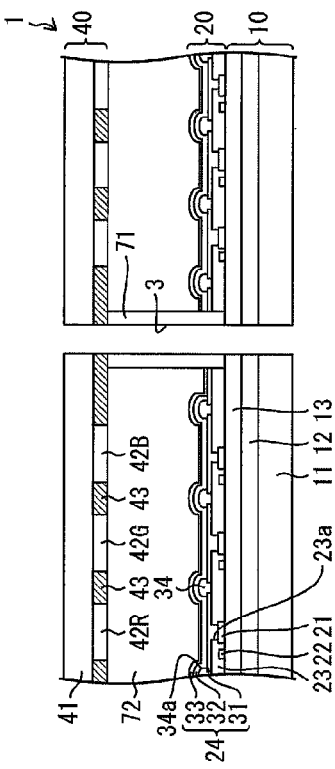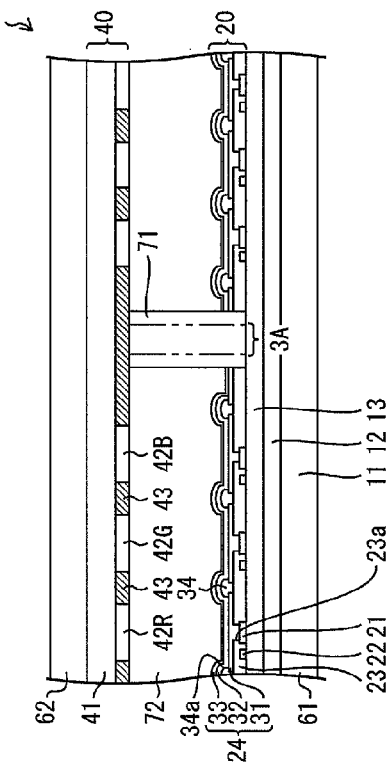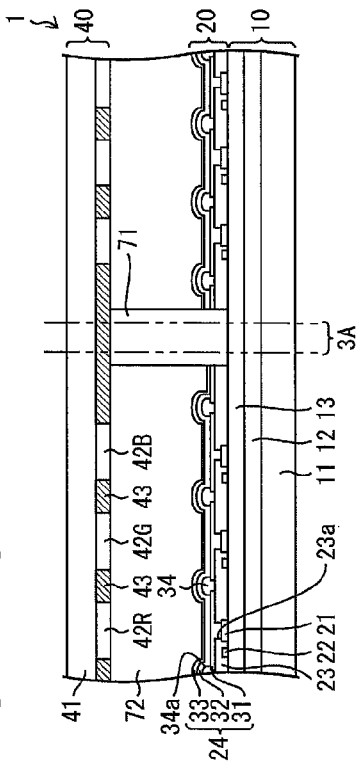

FLEXIBLE DISPLAY

TECHNICAL FIELD

The disclosure relates to a flexible display.

BACKGROUND ART

What is known as a flexible display, in which a display unit thereof can be flexibly changed in shape, has been attracting attention as a thin, light, and bendable display device (for example, see PTL 1 and PTL 2).

For example, PTL 1 discloses a folding type flexible display in which a housing alternately includes belt-shaped highly flexible regions and belt-shaped poorly flexible regions in a stripe pattern, and mountain-folding and valley-folding are alternately repeated in the above highly flexible regions, thereby making it possible to fold the display in a bellows form.

PTL 2 also discloses a folding type flexible display in which there are provided multiple bending sections, and at least one of end portions in a longitudinal direction of the display is folded at the bending section to be interfolded toward an inner side, therefore a rectangular flexible display can be a three-fold or a four-fold along a short side of the flexible display in a state before the flexible display being folded.

CITATION LIST

Patent Literature

PTL 1: JP 2015-45846 A (published Mar. 12, 2015)
PTL 2: JP 2015-43081 A (published Mar. 5, 2015)

SUMMARY

Technical Problem

However, as described in PTL 1 and PTL 2, any of the known folding type flexible displays can be bent only in one direction.

The reason for this is as follows: in a case where the flexible display is bent, in a case where the same portion thereof is bent two times or more while changing bending directions, the curvature becomes 0 (zero) at a fold center portion where the bending sections intersect with each other, therefore a crack is generated in the flexible display, interior elements are crushed, or the like, resulting in the flexible display being damaged.

As such, with the known flexible display, regardless of how many times the flexible display is folded, the length of a long side of the flexible display in a state of being folded cannot be made shorter than the length of a short side of the flexible display in a state of the flexible display before being folded.

Accordingly, the known flexible display can be miniaturized only in one direction, and the miniaturization is limited to the length of the short side of the flexible display in a state before the display being folded.

In consideration of the above problems, the disclosure has been conceived, and an object thereof is to provide a flexible display that can be folded in multiple directions.

Solution to Problem

In order to solve the above problems, a flexible display according to an aspect of the disclosure is flexible, includes multiple bending sections that are extended in directions intersecting with each other, and is provided with a through hole at a fold center portion where the bending sections intersect with each other.

Advantageous Effects of Disclosure

According to an aspect of the disclosure, a flexible display that can be folded in multiple directions can be provided.

BRIEF DESCRIPTION OF DRAWINGS

FIGS. 8A to 8D are end views illustrating an example of a manufacturing method for the flexible display in the order of processes according to the first embodiment of the disclosure.

FIGS. 17A to 17D are end views illustrating an example of a manufacturing method for the flexible display in the order of processes according to the second embodiment of the disclosure.

DESCRIPTION OF EMBODIMENTS

A detailed description follows regarding embodiments of the disclosure.
First Embodiment
A description follows regarding an embodiment of the disclosure, on the basis of FIGS. 1A and 1B to FIG. 15.
Schematic Configuration of Flexible Display
External Appearance of Flexible Display Hereinafter, the present embodiment will be described while exemplifying a case in which a flexible display according to the present embodiment is an organic EL display device.

Figure 1A:
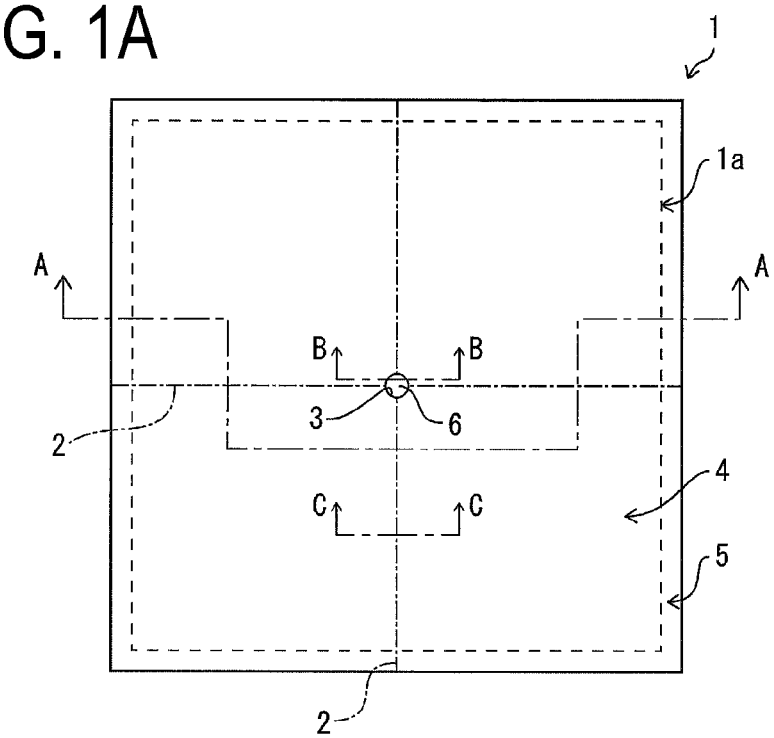
FIG. 1A is a plan view illustrating a schematic configuration of a flexible display in an expanded state according to a first embodiment of the disclosure.
Figure 1B:
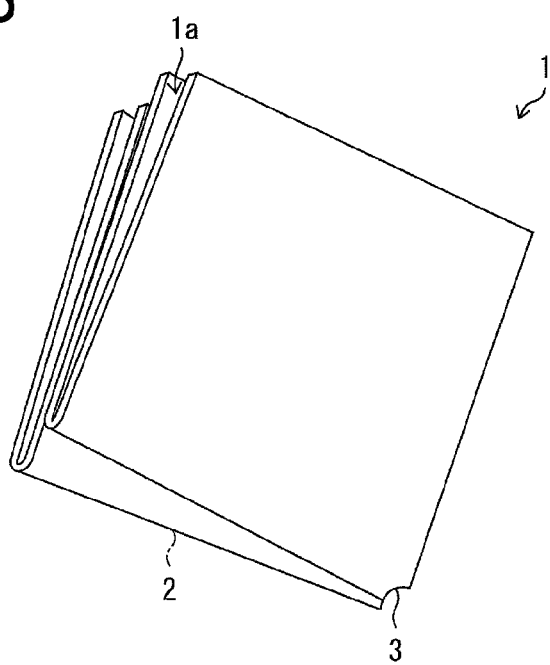
FIG. 1B is a perspective view illustrating a schematic configuration of the flexible display in a folded state according to the first embodiment of the disclosure.

FIG. 1A is a plan view illustrating a schematic configuration of a flexible display 1 in an expanded state according to the present embodiment, and FIG. 1B is a perspective view illustrating a schematic configuration of the flexible display 1 in a folded state according to the present embodiment.

Here, the "expanded state" refers to a state in which the flexible display 1 is in a state of 180-degree expansion, in other words, refers to a so-called full-flat state in which the flexible display 1 is made to be flat by being opened.

As illustrated in FIGS. 1A and 1B, the flexible display 1 according to the present embodiment is a folding type flexible image display device that is provided to be freely folded (bent) or expanded (extended).

Figure 3A:
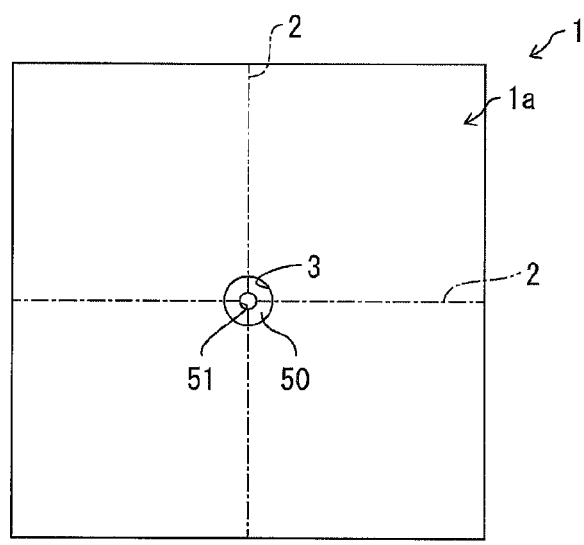
FIGS. 3A and 3B are plan views each illustrating an example of a usage example of a through hole in the flexible display according to the first embodiment of the disclosure.
Figure 3B:
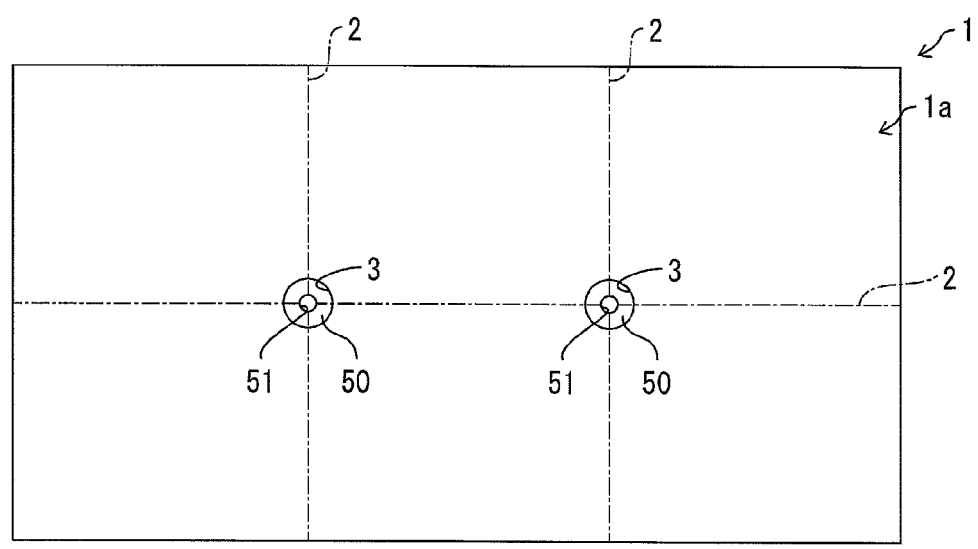

As illustrated in FIG. 1A, the flexible display 1 includes a display region 4 where an image is displayed and a frame region 5 which is a non-display region where an image is not displayed in a plan view. As illustrated in FIGS. 3A and 3B, the frame region 5 is formed in a frame shape surrounding the display region 4, and is provided on the periphery of the display region 4.

As illustrated in FIGS. 1A and 1B, the flexible display 1 includes, within the display region 4, a through hole 3 passing through the flexible display 1 in a thickness direction thereof. Because of this, within the display region 4, there is provided a non-display region 6 due to the through hole 3.

As illustrated in FIG. 1A, the flexible display 1 includes multiple bending sections 2, extended in directions intersecting with each other, where the flexible display 1 is bent. The bending section 2 is flexible and is provided to be capable of bending. Note that a section that is bent by one bend is one bending section 2. The bending section 2 is provided to connect end portions (outer edge portions) of the flexible display 1 to each other (to rephrase, connect an end portion (a first end portion) and another end portion (a second end portion) of the flexible display 1), and both end portions of the bending section 2 are respectively positioned at different end portions of the flexible display 1.

The flexible display 1 illustrated in FIGS. 1A and 1B is a four-fold display, and a total of two bending sections 2 are provided orthogonal to each other where each bending section is arranged along each side of the flexible display 1. In FIG. 1A, a bending center of the bending section 2 is indicated with a dot-dash line as a bending line.

The through hole 3 is provided at a fold center portion where the bending sections 2 intersect with each other. Here, the "fold center portion where the bending sections 2 intersect with each other" refers to a portion where the bending sections 2, when extended, intersect with each other, and more specifically refers to a portion at which the bending lines intersect with each other and the curvature becomes 0 (zero) when the flexible display 1 is bent in a state in which the through hole 3 is not formed.

In the flexible display 1 illustrated in FIGS. 1A and 1B, the bending sections 2 are provided to connect center portions of each of the sides of the flexible display 1, therefore each side of the flexible display 1 is divided into halves (in other words, bisected) at the center portion of each side thereof. Because of this, in the flexible display 1 illustrated in FIGS. 1A and 1B, one through hole 3 is provided at the center portion of the flexible display 1 in a plan view.

The bending sections 2 are sections that are flexible and can bend the flexible display 1, by bending the flexible display 1 along the bending sections 2 intersecting with each other, in a direction with which the bending direction intersects. The flexible display 1 can be bent in a direction with which the bending direction intersects at the bending section 2 because of at least the bending sections 2 being flexible and the through hole 3 being provided at the fold center portion. It goes without saying that the overall flexible display 1 may be flexible and may be freely bent at a portion other than the bending section 2 within a range in which the bending directions do not intersect with each other.

In the case where the flexible display 1 is an organic EL display device as discussed above, a layer where damage due to bending is most likely to be generated is an inorganic film such as SiNx or the like used in a barrier layer 13 (see FIGS. 6A and 6B), a sealing film 25, or the like to be explained later. For example, when tensile stress is applied to the inorganic film beyond the limit, there arises a risk of generation of a crack. Because of this, it is preferable for the flexible display 1 to prevent bending stress from being applied on the inorganic film to the utmost when the flexible display 1 is bent. Providing the through hole 3 in the fold center portion makes it possible to prevent the generation of a crack in the above inorganic film at the fold center portion.

As will be described later, sub pixels 7 (see FIG. 7) are provided in matrix form in the display region 4. Each sub pixel 7 is provided with, for example, an organic EL element 24 (see FIG. 6A) as a light emitting element (electro-optic element) for display.

The flexible display 1 according to the present embodiment can be bent, as illustrated in FIG. 1B, along the bending sections 2 (to be specific, along the bending lines indicated with the dot-dash lines) so that a display face 1a comes to an inner side or outer side of the flexible display 1. FIG. 1B illustrates a case, as an example, in which the flexible display 1 is bent so that the display face 1a comes to the inner side thereof.

A user carries the flexible display 1 in a state in which, for example, the flexible display 1 is folded and closed, as illustrated in FIG. 1B, so that the display face 1a of the flexible display 1 is positioned at the inside thereof, and uses the flexible display 1 in a state in which the flexible display 1 is opened, as illustrated in FIG. 1A, so that the display face 1a is expanded on a single plane (expanded state), for example.

The through hole 3 is formed in a precise circle shape in a plan view as illustrated in FIG. 1A, for example. However, as described later, the shape of the through hole 3 is not limited thereto.

In addition, a plane size of the through hole 3 is also not limited to any specific one, and may be appropriately configured in accordance with the thickness of the flexible display 1 or the like so that the through hole 3 is formed in a region where the curvature becomes 0 (zero). Note that the formation region of the through hole 3 becomes the non-display region 6 as discussed above. Because of this, it is preferable that the through hole 3 be formed to be small as much as possible within a range in which the flexible display 1 can be bent so that the bending sections 2 intersect with each other without causing damage in the flexible display 1, such as a crack being generated in the flexible display 1, interior elements such as organic EL elements being crushed, or the like.

Figure 2A:
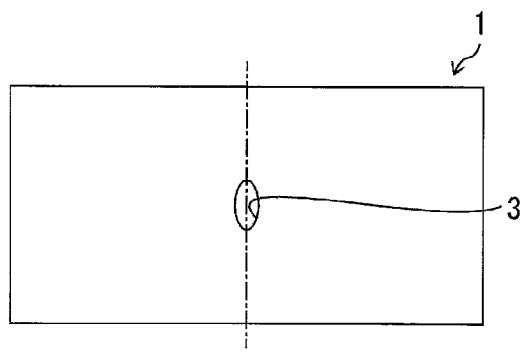
FIG. 2A is a plan view illustrating a schematic configuration of the flexible display in an expanded state according to the first embodiment of the disclosure.
Figure 2B:
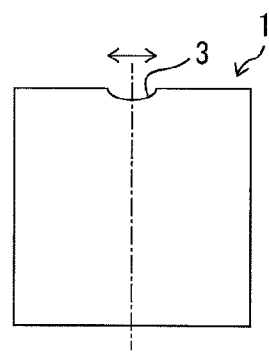
FIG. 2B is a plan view illustrating a schematic configuration of the flexible display 1 illustrated in FIG. 2A when the flexible display is bent once along a dotted line as illustrated in FIG. 2A.
Figure 2C:
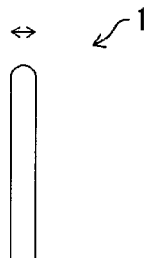
FIG. 2C is a side view illustrating a schematic configuration of the flexible display illustrated in FIG. 2B.
Figure 2D:
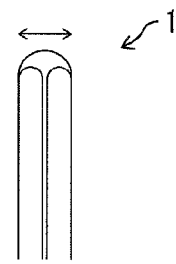
FIG. 2D is a side view illustrating a schematic configuration of the flexible display illustrated in FIGS. 2B and 2C when the flexible display is bent again along a dotted line as illustrated in FIG. 2B.

FIG. 2A is a plan view illustrating a schematic configuration of the flexible display 1 in an expanded state according to the present embodiment (in other words, a state before the first bend), FIG. 2B is a plan view illustrating a schematic configuration of the flexible display 1 illustrated in FIG. 2A when the flexible display 1 is bent once along a dotted line as illustrated in FIG. 2A, FIG. 2C is a side view illustrating a schematic configuration of the flexible display 1 illustrated in FIG. 2B, and FIG. 2D is a side view illustrating a schematic configuration of the flexible display 1 illustrated in FIGS. 2B and 2C when the flexible display 1 is bent again along a dotted line as illustrated in FIG. 2B. In FIGS. 2A to 2D, in order to facilitate the understanding of the bending directions, an example of a case in which the through hole 3 is formed in an oval shape is illustrated.

As illustrated in FIG. 2C, the flexible display 1 can be bent with a curvature radius equal to or greater than the limit curvature radius of the flexible display 1 at a time of the first bend. As illustrated in FIG. 2D, the flexible display 1, at its second bend time, can be bent with a curvature radius equal to or greater than twice the curvature radius of the first bend time of the flexible display 1. Accordingly, a radius of the through hole 3 in a direction perpendicular to the bending direction of at least the second bend time of the flexible display 1, is configured to be equal to or greater than the curvature radius of the second bend time.

At this time, for example, in a case where the flexible display 1 is an extremely thin display, the plane size of the through hole 3 can be reduced to be extremely small. In this case, the through hole 3 is unobtrusive, and although the through hole 3 is formed within the display region 4, display can be carried out without giving an uncomfortable feeling to the user.

Even in a case where the through hole 3 has a considerably large plane size, for example, where the flexible display 1 is a thin signage display with a large display size or the like, in a case where the plane size of the through hole 3 is sufficiently small compared to the plane size of the display face 1a in a plan view, the through hole 3 is not so obtrusive even when being formed within the display region 4. As such, by configuring the flexible display 1 in the manner as discussed above, the flexible display 1 can be carried while being folded in a smaller size than the known flexible display, and can perform display without giving an uncomfortable feeling.

FIGS. 3A and 3B are plan views each illustrating an example of a usage example of the through hole 3 in the flexible display 1 according to the present embodiment.

FIGS. 3A and 3B each illustrate an example of a case in which the through hole 3 is used for a button 50. A type of the button 50 is not limited to any specific one, and a fingerprint authentication button, various types of switches, and the like can be cited, for example.

Each of the buttons 50 illustrated in FIGS. 3A and 3B is thinner in thickness than a peripheral region of the through hole 3 (e.g. the display region 4 of the flexible display 1), and a region where the curvature becomes zero is small in comparison with the above peripheral region when the flexible display 1 is folded at the bending section 2.

Because of this, by disposing the button 50 within the through hole 3 and forming a through hole 51 that passes through the button 50 in the thickness direction in a region of the button 50 where the curvature becomes zero when the button 50 is folded at the bending section 2, the flexible display 1 can be bent at the bending section 2 and can effectively make use of the through hole 3. In this case, a substantial size of the through hole actually passing through the flexible display 1 can be reduced to the size of the through hole 51.

As discussed above, FIGS. 1A to FIG. 3A illustrate an example of the case of the four-fold display in which the bending sections 2 are provided to connect the center portion of each side of the flexible display 1 and one through hole 3 is provided in the center portion of the flexible display 1 in a plan view.

Note that the flexible display 1 according to the present embodiment is not limited thereto; for example, as illustrated in FIG. 3B, the flexible display 1 may be formed in a rectangular shape, and the bending sections 2 may be provided to divide one side (e.g., a short side) of the flexible display 1 into halves (e.g., bisect) and divide a side adjacent to the above-mentioned side (e.g., a long side) into three parts (e.g., trisect). In other words, the flexible display 1 according to the present embodiment may be six-fold display. The display is provided with two through holes 3 and two intersection points of the bending sections 2 in a plan view. The through holes 3 are provided at each of the positions where the bending sections 2 intersect with each other, as illustrated in FIG. 3B.

It goes without saying that the number of intersection points of the bending sections 2 and the number of through holes 3 are not limited to any specific ones as long as the flexible display 1 according to the present embodiment is configured to include at least one intersection point of the bending sections 2 and necessarily have the through hole 3 provided at the position where the bending sections 2 intersect with each other. Accordingly, although not illustrated, the flexible display 1 according to the present embodiment may be an eight-fold display, or may be a multiple-fold display with more than eight folds.

Figure 4A:
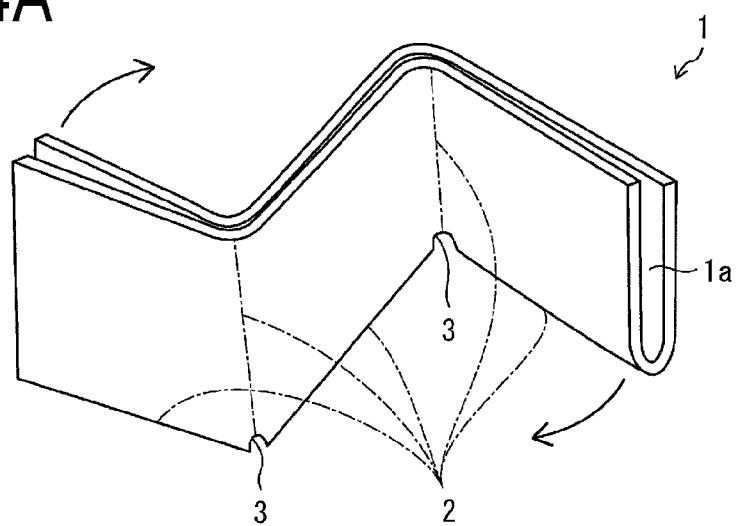
FIGS. 4A and 4B are perspective views illustrating an example of a folding method for the flexible display according to the first embodiment of the disclosure.
Figure 4B:
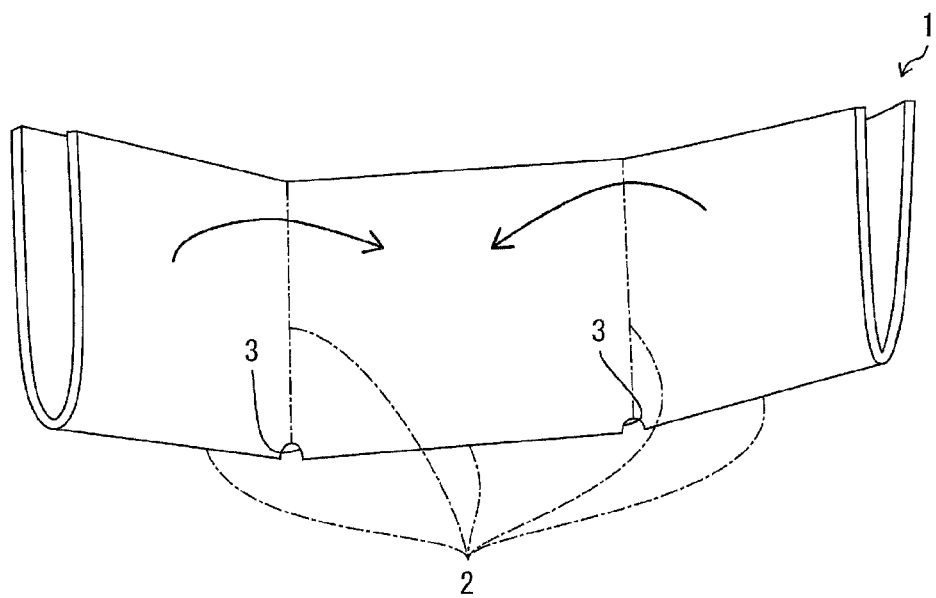

FIGS. 4A and 4B are perspective views illustrating an example of a folding method for the flexible display 1 according to the present embodiment. FIGS. 4A and 4B illustrate an example of a case in which the flexible display 1 according to the present embodiment is a six-fold display.

In addition, FIGS. 4A and 4B illustrate an example of a case in which the flexible display 1 is bent along a longitudinal direction of the flexible display 1 first, and thereafter the flexible display 1 is folded twice along a lateral direction of the flexible display 1. Note that the order of bending of the flexible display 1 is not limited to any specific one; that is, the flexible display 1 may be bent along the lateral direction of the flexible display 1 first, and thereafter the flexible display 1 may be bent along the longitudinal direction of the flexible display 1.

The flexible display 1 can be bent in the same manner as in the known method except that the stated flexible display 1 is bent in a direction with which the bending section 2 intersects. In other words, as illustrated in FIG. 4A, by alternately performing valley-folding and mountain-folding on the flexible display 1 in the same direction, the flexible display 1 may be folded in a bellows form; as illustrated in FIG. 4B, by performing valley-folding, on one of end portions of the flexible display 1, the other one of end portions thereof may be superposed.

Figure 5A:
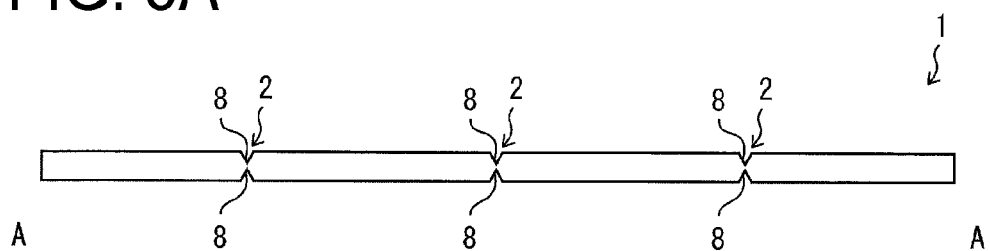
FIGS. 5A to 5C are views each schematically illustrating an example of a cross section of the flexible display illustrated in FIG. 1A when taken along an A-A arrow line.
Figure 5B:
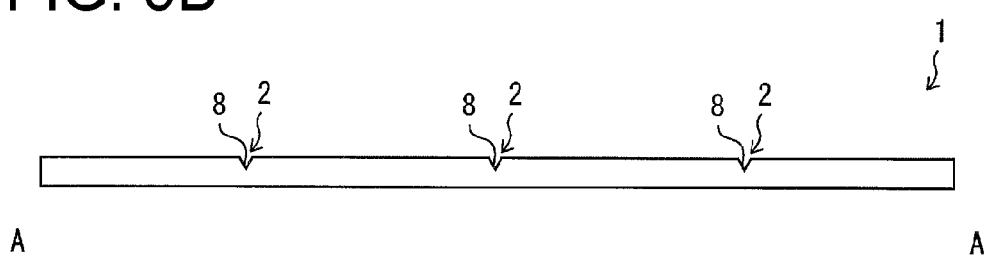
Figure 5C:
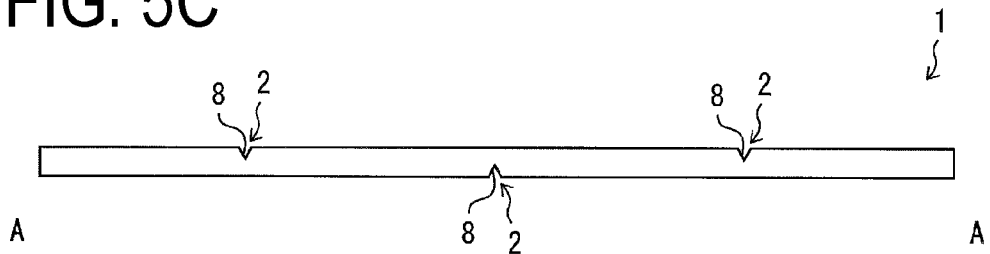
Figure 5D:
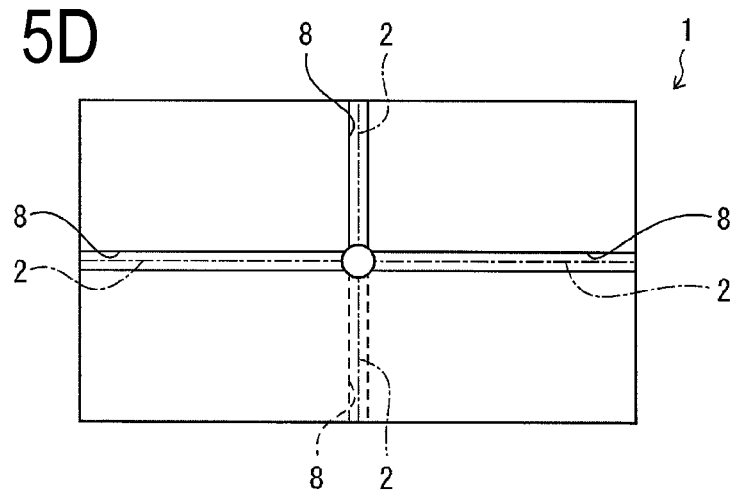
FIG. 5D is a plan view schematically illustrating formation positions of grooves of the flexible display illustrated in FIG. 5C.

FIGS. 5A to 5C are views each schematically illustrating an example of a cross section of the flexible display 1 illustrated in FIG. 1A when taken along the A-A arrow line, and FIG. 5D is a plan view schematically illustrating formation positions of grooves 8 of the flexible display 1 illustrated in FIG. 5C.

The flexible display 1 according to the present embodiment includes a support body 10 being flexible and a cover body 40 being flexible configured to sandwich and hold electro-optic elements.

A surface of the flexible display 1 may be leveled in accordance with hardness (flexibility), an elastic coefficient, stretching properties, thickness, or the like of the support body 10 and the cover body 40, a physical bend line such as a crease may be provided in the bending section 2, display of a bend line may be made to indicate capability of being bent, or grooves 8 may be formed as illustrated in FIGS. 5A to 5D.

A portion where the groove 8 is formed is thinner in thickness than other portions. As such, the forming of the grooves 8 in the bending sections 2 makes it possible to improve bendability of the flexible display 1 and reduce a region where the curvature becomes zero when the flexible display 1 is bent, thereby making it possible to reduce the plane size of the through hole 3.

The shape of the groove 8 is not limited to any specific one, and may take a concave shape, a V shape, or a curved shape with a curvature.

In the case where the groove 8 is formed in the bending section 2 as discussed above, although it is desirable for the width of the groove 8 to be as small as possible, the width of the groove 8 is not limited to any specific one as long as the groove 8 is formed such that at least a center line of the groove 8 to become the bending center is positioned at a boundary portion between adjacent sub pixels 7. For example, as described above, in the case where the flexible display 1 is a thin signage display with a large display size and the width of the groove 8 is sufficiently small compared to the plane size of the display face 1*a*, the groove 8 is not obtrusive even when being formed within the display region 4 and therefore can perform display without giving an uncomfortable feeling.

It is sufficient that the depth of the groove 8 is appropriately configured in accordance with the curvature or the like obtained when the flexible display 1 is bent, and the depth thereof is not limited to any specific one as long as the inorganic film likely to be damaged by the bending can be sufficiently protected from external forces such as shock and abrasion.

As illustrated in FIG. 5A, the grooves 8 may be provided at the respective bending sections 2 in both front and rear surfaces of the flexible display 1 (in other words, the display face 1*a* and its opposite face) to overlap with each other in a plan view, or may be provided in only one surface of the flexible display 1 as illustrated in FIG. 5B. Although FIG. 5B illustrates an example of the case in which the grooves 8 are formed only on a front surface side of the flexible display 1 (a side of the cover body 40), it is needless to say that the grooves 8 may be formed only on a rear surface side of the flexible display 1 (a side of the support body 10).

For example, in order to prevent tensile stress from applying on a moisture prevention layer, a sealing layer, or the like, in a case where the display face 1*a* is bent toward the inner side, the grooves 8 may be formed only in a display-side film such as a protection film, a touch panel, or a polarizing plate; in a case where the display face 1*a* is bent toward the outer side, the grooves 8 may be formed only in a rear-surface side film.

Further, in order to guide the bending direction, the groove 8 may be formed only in the bending section 2, among the bending sections 2, that is positioned on the inner side when the flexible display 1 is folded, or only in the bending section 2 that is valley-folded when the flexible display 1 is folded as illustrated in FIGS. 5C and 5D.

Although FIGS. 5C and 5D illustrate an example of the case in which the flexible display 1 illustrated in FIG. 1A is folded as illustrated in FIG. 1B, it is to be noted that the formation position of the groove 8 may be appropriately changed in accordance with the folding method for the flexible display 1.

Layer Configuration of Flexible Display 1

Next, an example of a layer configuration of the flexible display 1 according to the present embodiment will be described below with reference to FIGS. 6A and 6B as well as FIG. 7.

Figure 6A:
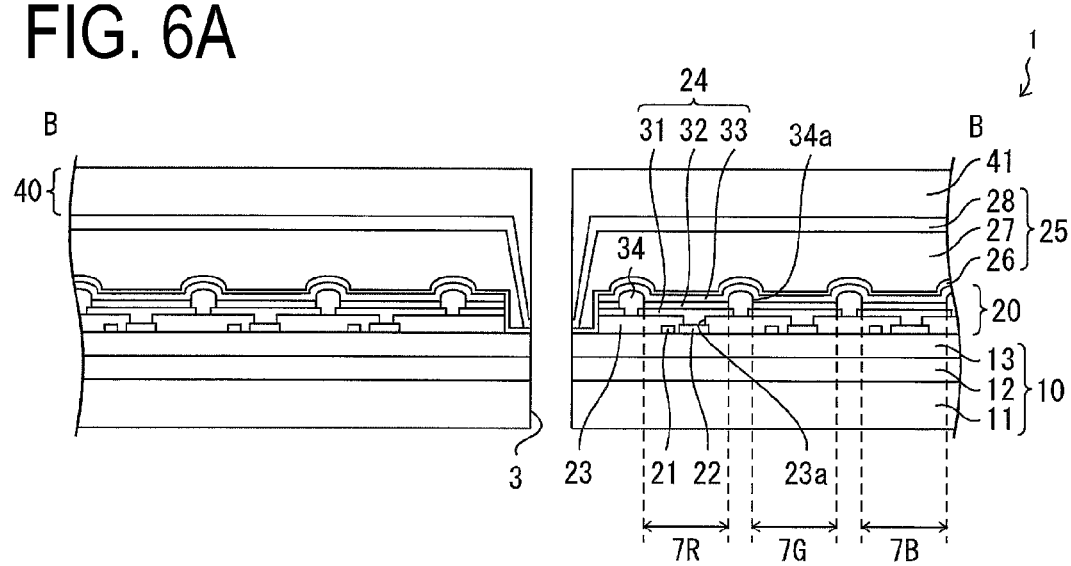
FIG. 6A is an end view of the flexible display illustrated in FIG. 1A when taken along a B-B line.
Figure 6B:
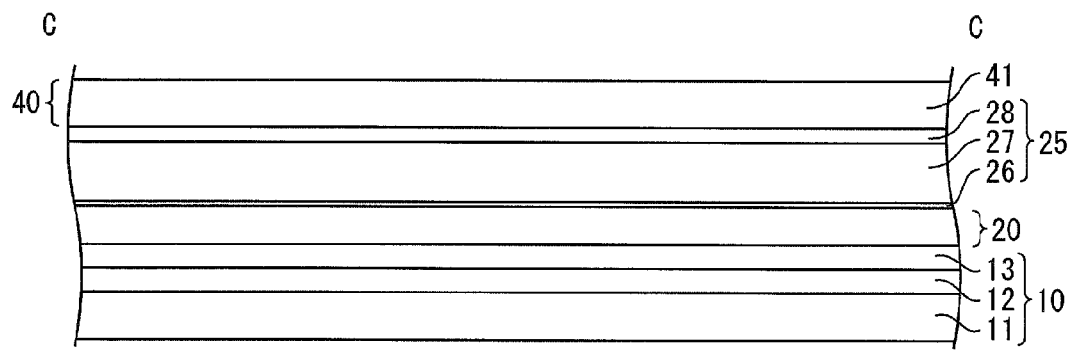
FIG. 6B is an end view of the flexible display illustrated in FIG. 1A when taken along a C-C line.

FIG. 6A is an end view of the flexible display illustrated in FIG. 1A when taken along the B-B line, and FIG. 6B is an end view of the flexible display illustrated in FIG. 1A when taken along the C-C line. FIG. 6A illustrates an example of a schematic configuration of the periphery of the through hole 3 of the flexible display 1 according to the present embodiment. FIG. 6B illustrates an example of a schematic configuration of the bending section 2 where the through hole 3 is not formed in the flexible display 1 according to the present embodiment.

FIGS. 6A and 6B illustrate an example of a schematic configuration of a major portion of an organic EL display device as an example of a schematic configuration of a major portion of the flexible display 1 according to the present embodiment. For the sake of convenience in illustration, illustrations of respective layers within a display circuit layer 20 are omitted in FIG. 6B. Further, although FIG. 6B illustrates an example of a case in which the groove 8 is not formed in the bending section 2, the grooves 8 may be formed in a surface of a rear-surface film 11 and a surface of the cover body 40 respectively, as discussed before.

Figure 7:
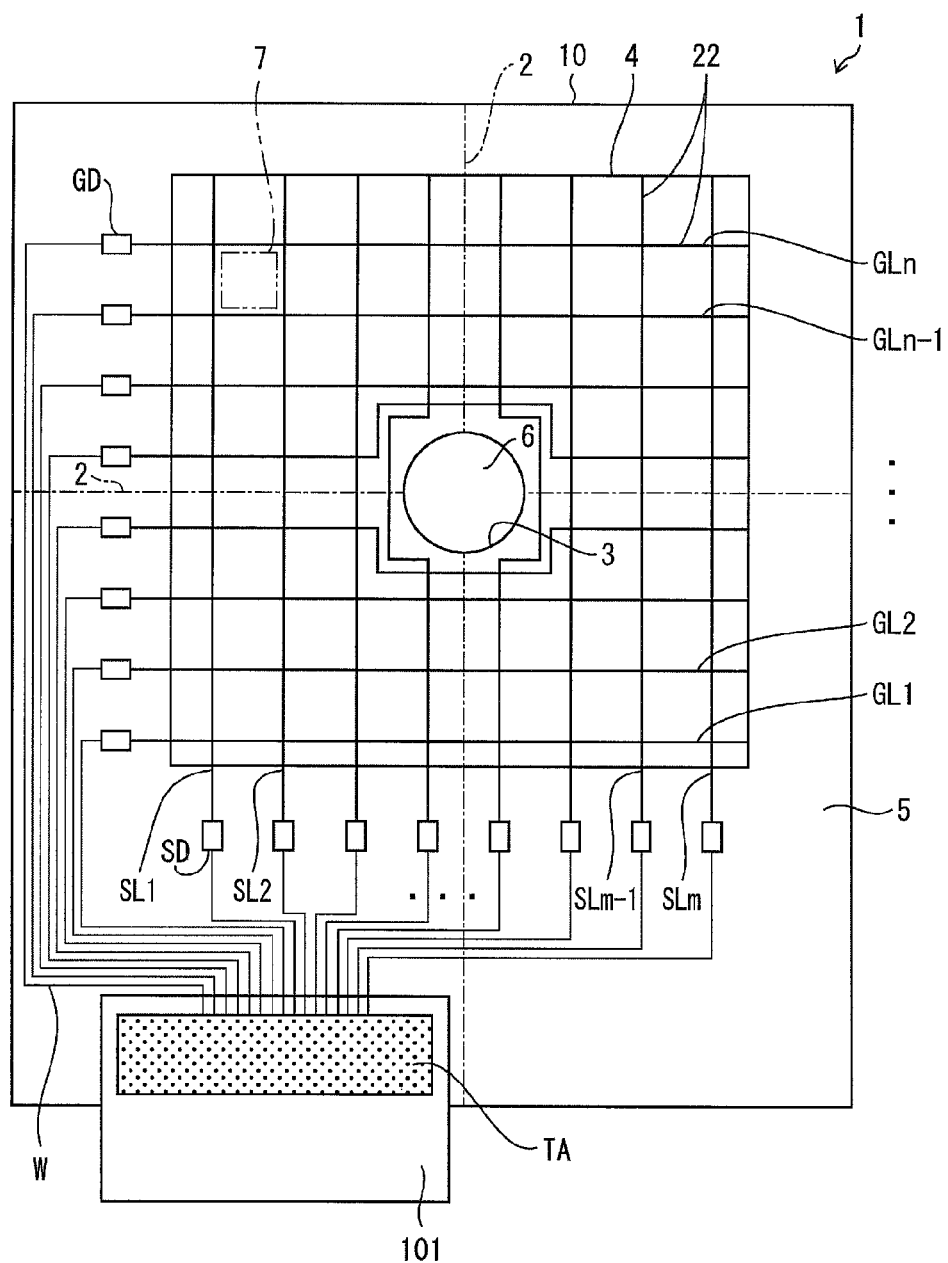
FIG. 7 is a plan view illustrating an example of a wiring line structure of the flexible display according to the first embodiment of the disclosure.

FIG. 7 is a plan view illustrating an example of a wiring line structure of the flexible display 1 according to the present embodiment. For the sake of convenience in illustration, some pieces of wiring lines 22 are omitted in FIG. 7. As such, for the sake of convenience in illustration, FIG. 7 describes the plane size of the through hole 3 with a considerably larger scale than an actual scale with respect to the support body 10.

As illustrated in FIGS. 6A and 6B, the flexible display 1 according to the present embodiment includes the support body 10 that is flexible and insulative, the display circuit layer 20 formed on the support body 10, the sealing film 25 covering the display circuit layer 20, and the cover body 40 (opposing support body) that is formed on the sealing film 25 and is flexible and insulative. A bonding layer (not illustrated) may be provided, as needed, between the sealing film 25 and the cover body 40.

The support body 10 includes, for example, a support film 12 and the barrier layer 13 provided on the support film 12. As illustrated in FIGS. 6A and 6B, the rear-surface film 11 may be further provided, as needed, on a surface of the support film 12 on the opposite side to the surface thereof where the barrier layer 13 is provided.

The flexible display 1 illustrated in FIGS. 6A and 6B has a configuration in which the rear-surface film 11, the support film 12, and the barrier layer 13 are provided in that order from the rear-surface film 11 side as the support body 10. A bonding layer (not illustrated) may be provided between the rear-surface film 11 and the support film 12.

The groove 8 may be provided in the surface of the rear-surface film 11 as discussed above. The groove 8 may be provided in the support film 12 in a case where the bonding layer and the rear-surface film 11 are not provided.

As the rear-surface film 11 and the support film 12, a flexible insulative film such as a polyimide film or the like can be used. Although the thicknesses of the rear-surface film 11 and the support film 12 are not limited to any specific one, it is desirable for the films to be formed to be as thin as possible so that the flexible display 1 can be bent with ease.

Various types of well-known bonding agents can be used for a bonding agent constituting the above bonding layer.

The barrier layer 13 is provided across the entire surface of the support film 12. With this, the barrier layer 13 covers the support film 12 without exposing the surface of the support film 12. This makes it possible to prevent a drug solution, moisture, and the like from adhering to the support film 12. Accordingly, even in a case where a base material made of a material that is vulnerable to a drug solution such as polyimide is used as the support film 12, the elution and process contamination of the support film 12 due to the drug solution can be prevented.

It is sufficient that the barrier layer 13 is insulative and can protect the support film 12 from a drug solution, moisture, and the like; accordingly, the thickness and the material thereof are not specifically limiting. For the barrier layer 13, an inorganic insulating layer formed with an oxide of silicon (Si), Al, or the like (SiOx, $Al_2O_3$, or the like), nitride (SiNx, SiON, SiCN), or the like can be used, for example.

On the support body 10, there is provided the display circuit layer 20 including, for example, a TFT 21 (driving element), the wiring line 22, a flattening film 23, and the organic EL element 24 (an electro-optic element, a light emitting element).

The wiring line 22 includes, as illustrated in FIG. 7, multiple gate wiring lines GL1, GL2, . . . , GLn-1, and GLn (n is an arbitrary integer, and hereinafter these gate wiring lines are collectively referred to as "gate wiring lines GL"), multiple source wiring lines SL1, SL2, . . . , SLm-1, and SLm (m is an arbitrary integer, and hereinafter these source wiring lines are collectively referred to as "source wiring lines SL"), holding capacitor wiring lines (not illustrated), shared electrode lines (not illustrated), and the like.

The flexible display 1 according to the present embodiment is an active matrix type display device in which, as illustrated in FIG. 7, the display region 4, the multiple gate wiring lines GL, the multiple source wiring lines SL, gate drivers GD configured to drive the respective gate wiring lines GL, and source drivers SD configured to drive the respective source wiring lines SL are built-in on the support body 10 where the barrier layer 13 (see FIGS. 6A and 6B) is provided.

In the present embodiment, for the sake of convenience in explanation, the explanation will be given considering that an extension direction of the gate wiring line GL is a row direction (lateral direction), and that an extension direction of the source wiring line SL is a column direction (longitudinal direction). However, the extension direction of the gate wiring line GL may be considered as a column direction, and the extension direction of the source wiring line SL may be considered as a row direction.

Although detailed description will be omitted herein, the gate wiring line GL and the source wiring line SL are provided in different layers from each other. As illustrated in FIG. 7, for example, a red sub pixel 7R, a green sub pixel 7G, or a blue sub pixel 7B is disposed as the sub pixel 7 in each of regions surrounded by the gate wiring lines GL and the source wiring lines SL in lattice form in a plan view, and a set of the sub pixels 7 of these colors forms one pixel.

As illustrated in FIG. 6A, the TFT 21 is provided in each of the sub pixels 7. Each of the TFTs 21 is connected to the wiring line 22, selects the sub pixel 7, by the gate wiring line GL, to which a signal is inputted, determines an amount of charge, by the source wiring line SL, to be inputted to the selected sub pixel 7, and flows a current from a power source line into the organic EL element 24.

The TFTs 21 and the wiring line 22 are covered with the flattening film 23. As a material of the flattening film 23, an insulative material such as an acrylic resin, a polyimide resin, or the like can be used. It is sufficient for the thickness of the flattening film 23 to be capable of eliminating a step on an upper face of the TFT 21 and the wiring line 22, and therefore the thickness thereof is not limited to any specific one.

The organic EL element 24 has a configuration in which a first electrode 31 (a positive electrode, a lower electrode), an organic EL layer 32 (an EL layer, a functional layer) made of an organic layer including at least a light emitting layer (not illustrated), and a second electrode 33 (a negative electrode, an upper electrode) are formed in that order from the support body 10 side. Layers between the first electrode 31 and the second electrode 33 are collectively referred to as the organic EL layer 32 in the present embodiment.

In addition, on the second electrode 33, an optical adjustment layer (not illustrated) to carry out optical adjustment, a protection layer to protect the second electrode 33 and prevent oxygen, moisture, and the like from entering into the organic EL element 24 from the exterior, or the like may be formed. In the present embodiment, the organic EL layer 32 and the electrode layers (the first electrode 31 and the second electrode 33) that are formed in each sub pixel 7, and the optical adjustment layer (not illustrated) and the protection layer (not illustrated) that are formed as needed are collectively referred to as the organic EL element 24.

The first electrode 31 is formed on the flattening film 23. The first electrode 31 injects (supplies) holes into the organic EL layer 32, while the second electrode 33 injects electrons into the organic EL layer 32. The holes and electrons injected into the organic EL layer 32 are recombined in the organic EL layer 32, thereby forming excitons. The exciton having been formed radiates light when it is deactivated from an excitation state to a base state, and the radiated light is emitted to the exterior from the organic EL element 24.

The first electrode 31 is electrically connected to the TFT 21 through a contact hole 23a formed in the flattening film 23.

The first electrode 31 is a pattern electrode formed in an island-like pattern for each sub pixel 7, and an end portion of the first electrode 31 is covered with an edge cover 34. The edge cover 34 is an organic insulating layer and is formed of a photosensitive resin such as an acrylic resin, polyimide resin, or the like. The edge cover 34 prevents a short-circuit with the second electrode 33 due to a concentration of electrodes, the thinned organic EL layer 32, or the like at the end portion of the first electrode 31. In addition, the edge cover 34 also functions as a pixel separation film in order to prevent a current from flowing into the adjacent sub pixel 7.

The edge cover 34 is provided with an opening 34a for each sub pixel 7. An exposed portion of the first electrode 31 by this opening 34a is a light emitting region of each sub pixel 7.

The organic EL layer 32 has a configuration in which a hole injecting layer, a hole transport layer, a light emitting layer, an electron transport layer, an electron injecting layer, and the like are layered in that order from the first electrode 31 side, for example. Note that a single layer may have multiple functions. For example, in place of the hole injecting layer and the hole transport layer, a hole injection-cum-transport layer having the functions of the above two layers may be provided. Further, in place of the electron injecting layer and the electron transport layer, an electron injection-cum-transport layer having the functions of the above two layers may be provided. Furthermore, a carrier blocking layer may appropriately be provided between the respective layers.

Note that FIG. 6A illustrates an example of a case in which, in order for the organic EL layer 32 of the organic EL element 24 to emit light of different colors for each sub pixel 7, light emitting layers of different colors are selectively applied and vapor-deposited in a region surrounded by the edge cover 34 (that is, the opening 34a). With this, the flexible display 1 according to the present embodiment emits red light from the red sub pixel 7R, green light from the green sub pixel 7G, and blue light from the blue sub pixel 7B, thereby realizing full color image display.

As discussed above, the flexible display 1 according to the present embodiment includes the organic EL element 24 of a selective RGB application system. Because of this, display with red light, green light, and blue light can be performed without using color filters.

Note that the configuration of the flexible display 1 according to the present embodiment is not limited thereto; for example, a red CF layer that passes red light therethrough, a green CF that passes green light therethrough, and a blue CF layer that passes blue light therethrough may be further provided as a CF layer in each sub pixel 7.

The second electrode 33 is formed on the organic EL layer 32. Although FIG. 6A illustrates an example of a case in which the second electrode 33 is a shared electrode provided to be shared by all the sub pixels 7, the second electrode 33 may be a pattern electrode formed in an island-like shape for each sub pixel 7, and the second electrodes 33 each patterned in the island-like shape may be connected to each other by auxiliary wiring line (not illustrated) or the like.

Although it is described that the first electrode 31 is a positive electrode and the second electrode 33 is a negative electrode in the present embodiment, the first electrode 31 may be a negative electrode and the second electrode 33 may be a positive electrode. Note that in this case, the order of the layers constituting the organic EL layer 32 is reversed.

Further, in a case where the flexible display 1, to rephrase, the organic EL display device is a top-emitting type device configured to emit the light from the cover body 40 side, it is preferable that the first electrode 31 be formed by a reflective electrode and the second electrode 33 be formed by a transparent electrode or a semi-transparent electrode.

Meanwhile, in a case where the organic EL display device is a bottom-emitting type device configured to emit the light from a rear surface side of the support body 10, the electrode structure is reversed with respect to the structure of the top-emitting type. In other words, in the case where the organic EL display device is a bottom-emitting type device, it is preferable that the first electrode 31 be formed by a transparent electrode or semi-transparent electrode and the second electrode 33 be formed by a reflective electrode.

In the display region 4 of the flexible display 1, the sealing film 25 formed to seal the organic EL element 24 between the support body 10 and the sealing film 25 is formed, as illustrated in FIGS. 6A and 6B.

The sealing film 25 prevents the organic EL element 24 from being deteriorated due to moisture, oxygen, or the like entering from the exterior.

An organic layer (optical adjustment layer) may be formed (not illustrated) between the second electrode 33 and the sealing film 25 for adjusting optical characteristics, or an electrode protection layer for protecting the second electrode 33 may be formed therebetween.

The sealing film 25 of the flexible display 1 according to the present embodiment has a structure in which, on the second electrode 33, a first inorganic film 26, an organic film 27, and a second inorganic film 28 are layered in that order from the second electrode 33 side.

As the first inorganic film 26 and the second inorganic film 28, like in the case of the barrier layer 13, an inorganic insulating layer formed with an oxide of silicon (Si), Al, or the like (SiOx, $Al_2O_3$, or the like), nitride (SiNx, SiON, SiCN), or the like can be used, for example.

As the organic film 27, an organic insulating layer formed of an organic material such as acrylate, polyurea, parylene, polyimide or polyamide, or the like can be cited, for example.

The first inorganic film 26 and the second inorganic film 28 have a moisture prevention function to prevent moisture from entering, and function as a barrier layer.

Meanwhile, the organic film 27 is used as a buffer layer (stress relaxation layer), and mainly performs stress relaxation on inorganic films such as the first inorganic film 26, the second inorganic film 28 and the like, performs leveling by eliminating the step portion on the surface of the first inorganic film 26 due to the organic EL element 24, and the like. Note that, as illustrated in FIG. 6A, the organic film 27 is not provided in the periphery of the through hole 3, thereby preventing the organic film 27 from being exposed on an inner wall of the through hole 3. Due to this, the second inorganic film 28 is provided in contact with the first inorganic film 26 in the periphery of the through hole 3.

In addition, as described before, a bonding layer (not illustrated) may be provided, as needed, between the sealing film 25 and the cover body 40. Various types of well-known bonding agents having moisture prevention properties can be used for the bonding layer.

The cover body 40 is formed with, for example, a cover film 41 (surface film) which is flexible and transparent. The groove 8 may be provided in the surface of the cover film 41 as discussed before.

The same material as that of the support film 12 and the rear-surface film 11, for example, can be used for the cover film 41.

The cover body 40 may further include a functional layer such as a barrier layer or the like, and may furthermore include a functional layer formed with a functional film such as a polarizing film, a touch sensor film, or the like, as needed. The same material as that of the barrier layer 13 can be used for the barrier layer, for example. Bonding layers (not illustrated) may respectively be provided between the above-discussed layers.

A hard coat layer such as a hard coat film may be further provided as the above-mentioned functional layer on the cover film 41. The hard coat layer may include a groove or the like in the bending section 2 to have a thickness capable of being bent at the bending section 2 and may be formed thin with respect to a non-bending section, or may be provided separate from the bending section 2. It goes without saying that the through hole 3 is also provided in surfaces of these functional layers.

As illustrated in FIG. 7, in the frame region 5 of the flexible display 1, a terminal section TA of the respective wiring line 22 (e.g., the gate wiring line GL, source wiring line SL, holding capacitor wiring line, shared electrode line, and the like) is provided, and a mounting region of a flexible printed circuit (FPC) board 101 is provided. The terminal section TA in which multiple terminals are provided and a FPC board 101 are pasted with an Anisotropic Conductive Film (ACF) (not illustrated). The terminal section TA is exposed from the cover film 41 and is not covered with the cover film 41.

Signals or a reference potential supplied from a display control circuit (not illustrated) is inputted to the terminal section TA through wiring line (not illustrated), thereby controlling the driving of the TFT 21. The display control circuit may be mounted on a control board connected via the FPC board 101, or may be provided on the FPC board 101.

The display control circuit includes an input connector, a timing controller, a power source IC, and the like, supplies, to the gate driver GD, timing signals such as a gate start pulse signal and a gate clock signal, a power source, an address specifying signal as needed, and the like, and supplies, to the source driver SD, timing signals such as a source start pulse signal, a source clock signal, and a polarity reversal signal, gray scale data, a power source, and the like.

As illustrated in FIG. 7, the gate driver GD is provided in the frame region 5 adjacent to one side in an extension direction of each gate wiring line GL relative to the display region 4, for example. As illustrated in FIG. 7, the source driver SD is provided in the frame region 5 adjacent to one side in an extension direction of each source wiring line SL relative to the display region 4.

In the present embodiment, signals to drive the gate driver GD are supplied from, for example, the terminal section TA provided on the source driver SD side. The terminal section TA is provided in the frame region 5 adjacent to one side in the extension direction of each source wiring line SL, for example. The terminal section TA, the source drivers SD, and the gate drivers GD are connected to one another by wiring.

FIG. 7 illustrates an example of a case in which a single terminal section TA is provided in the flexible display 1. However, the present embodiment is not limited thereto. Although not illustrated, the terminal section TA may be provided being divided into two portions with the bending section 2 interposed therebetween so as not to overlap with the bending section 2 in FIG. 7, as described in a modification which will be explained later.

The gate drivers GD supply gate pulses in sequence to each of the gate wiring lines GL. The source drivers SD output data signals to each of the source wiring lines SL in accordance with control signals inputted from the display control circuit.

Each of the gate drivers GD and source drivers SD may be, for example, a monolithic circuit that uses amorphous silicon, low-temperature polysilicon, or an oxide semiconductor such as an InGaZnO-based oxide semiconductor and is monolithically built-in on the support body 10 (e.g., the support film 12), or may be formed with an IC chip.

Further, the gate drivers GD and the source drivers SD may be formed with single IC chips respectively; alternatively, multiple gate drives GD each formed of a single IC chip or multiple source drivers SD each formed with a single IC chip may be provided. Furthermore, the IC chip including the source driver SD may include the configuration of the gate driver GD therein, or may include part of the display control circuit therein.

As illustrated in FIGS. 6A, the through hole 3 is provided passing through the flexible display 1 in the thickness direction thereof.

Because of this, in the display circuit layer 20, as illustrated in FIG. 6A and FIG. 7, elements such as the TFT 21 and the organic EL element 24, and the wiring line 22 such as the gate wiring line GL and the source wiring line SL in the periphery of the through hole 3 are formed separate from the through hole 3.

In the example illustrated in FIG. 7, of all the gate wiring lines GL and all the source wiring lines SL, the gate wiring lines GL and source wiring lines SL facing the through hole 3 (non-display region 6) are formed separate from the through hole 3 to bypass the through hole 3. With this, the gate wiring lines GL and source wiring lines SL facing the through hole 3 are extended to the terminal section TA in the display region 4.

Manufacturing Method for Flexible Display 1

A manufacturing method for the flexible display 1 will be described next.

FIGS. 8A to 8D are end views illustrating an example of a manufacturing method for the flexible display 1 in the order of processes according to the present embodiment. FIGS. 8A to 8D each illustrate an end face corresponding to an end face taken by cutting the flexible display 1 along the B-B line illustrated in FIGS. 1A and 1B.

In the present embodiment, the support film 12 is formed first on a carrier substrate 61, as illustrated in FIG. 8A. The support film 12 may be a mother base material.

For example, polyimide is applied on the carrier substrate 61 and baked, thereby forming a polyimide layer (a polyimide film) as the support film 12.

As the carrier substrate 61, a glass substrate (carrier glass) can be used, for example. Hereinafter, a carrier glass is used as the carrier substrate 61. However, the present embodiment is not limited thereto, and various types of substrates having been used as carrier substrates or transfer substrates can be used as the above carrier substrate 61.

For example, a plastic substrate such as a thermoplastic resin or a thermosetting resin may be used as the carrier substrate 61. As the plastic substrate, for example, an acrylic resin, polyethylene terephthalate (PET), an epoxy resin, a phenol resin, and the like can be cited.

Next, the barrier layer 13 formed with the above-mentioned inorganic insulating layer is deposited on the surface of the support film 12 by, for example, the Chemical Vapor Deposition (CVD) method, the sputtering method, the Atomic Layer Deposition (ALD) method, or the like. With this, a barrier film of moisture and an organic component is formed.

Subsequently, on the barrier layer 13, the TFT 21, the wiring line 22, the flattening film 23, the first electrode 31, the edge cover 34, the organic EL layer 32, and the second electrode 33 are formed in that order as the display circuit layer 20 in a region corresponding to the display region 4 of each individual flexible display 1 (e.g., an organic EL display device) using the well-known method. For selective application of the light emitting layer, vacuum vapor deposition, an ink-jet method, or the like can be used. As an example in the present embodiment, the second electrode 33 and layers, other than the light emitting layer, of the organic EL layer 32 in the organic EL element 24 are formed in the entire region other than the frame region 5 in the support body 10. However, in the present embodiment, the TFT 21, the wiring line 22, the flattening film 23, the first electrode 31, the edge cover 34, the organic EL layer 32, and the second electrode 33 are formed separate from a hole opening area 3A, which is a through hole formation-planned region, and its peripheral region (that is, a region surrounding the hole opening area 3A with a constant width).

Thereafter, the sealing film 25 formed of the first inorganic film 26, the organic film 27, and the second inorganic film 28 is formed to cover the display circuit layer 20.

In the present embodiment, as illustrated in FIGS. 6A and 6B and FIG. 8A, in order to seal the organic EL element 24 between the sealing film 25 and the support body 10, first of all, the first inorganic film 26 is deposited on the entire display region 4 including the hole opening area 3A to cover the upper side of the second electrode 33 and a layered end face of each layer between the barrier layer 13 and the first inorganic film 26.

Next, on the first inorganic film 26, the organic film 27 is formed separate from the hole opening area 3A and its peripheral region.

Thereafter, the second inorganic film 28 is deposited on the entire display region 4 including the hole opening area 3A to cover the first inorganic film 26 and the organic film 27.

Note that, for the film formation of the first inorganic film 26 and the second inorganic film 28, the CVD method, the vacuum vapor deposition, or the like can be used, for example. For the film formation of the organic film 27, the ink-jet method, the vacuum vapor deposition, or the like can be used, for example.

Next, a bonding layer (not illustrated) is formed as needed on the sealing film 25 by applying, for example, a bonding agent thereupon, and the cover film 41 is pasted as the cover body 40 on the sealing film 25 via the above bonding layer, for example.

The cover film 41 made of the same material as the support film 12 can be used for the cover film 41. The cover film 41 may be formed on the sealing film 25 using the same method as in the case of the support film 12. Further, in a case that the cover body 40 includes a barrier layer, the barrier layer can be formed using the same method as the barrier layer 13.

Thereafter, as illustrated in FIG. 8B, a laser beam is radiated from the carrier substrate 61 side onto an interface between the carrier substrate 61 and the support film 12 to cause ablation, whereby the carrier substrate 61 is peeled at the above interface. At this time, the cover film 41 functions as a support body when the carrier substrate 61 is peeled.

In the case where the carrier substrate 61 is peeled by ablation at the interface between the carrier substrate 61 and the support film 12 in the manner described above, a laser beam with a wavelength absorbed in the support film 12 is used as the laser beam. For example, in the case where the support film 12 is a polyimide layer, a laser beam with a peak wavelength of 355 nm, 343 nm, 308 nm, or the like is used as the laser beam.

As discussed above, in the present embodiment, the case in which the carrier substrate 61 and the support film 12 are layered in direct contact with each other, and the carrier substrate 61 is peeled by ablation at the interface between the carrier substrate 61 and the support film 12 is exemplified and explained. However, the present embodiment is not limited thereto.

For example, a peeling layer (not illustrated) may be formed between the carrier substrate 61 and the support film 12, and the carrier substrate 61 and the peeling layer may be peeled at an interface between the peeling layer and the support film 12 by radiating the laser beam from the carrier substrate 61 side to the peeling layer. In this case, the light used for peeling is not limited to a laser beam, and may be, for example, flash lamp light or the like.

A well-known peeling layer having been used for transfer in manufacturing a flexible display, such as a heat absorption layer or the like, can be used for the peeling layer.

To be more specific, as the above peeling layer, a layer made of a material whose viscosity and adhesive force are lowered by heating, a layer that is peeled by desorbing hydrogen through light radiation such as hydriding amorphous silicon, a layer that is peeled by making use of a difference in film stress, or the like can be used, for example.

For example, as the peeling layer, various types of oxide ceramics such as amorphous silicon, silicon oxide, titanium oxide, zirconium oxide and lanthanum oxide; ceramics such as PZT, PLZT, PLLZT and PBZT or dielectrics of these ceramics; nitride ceramics such as silicon nitride aluminum nitride and titanium nitride; organic polymers, alloys, or the like can be used, for example.

The support film 12 is formed on the peeling layer when the peeling layer is formed as described above.

Next, as illustrated in FIG. 8C, the rear-surface film 11 is bonded to a surface of the support film 12 on the opposite side to the display circuit layer 20 via, for example, a bonding layer (not illustrated).

At this time, in a case where the cover body 40 is configured to include a polarizing film and a touch sensor film, a terminal is prepared by removing part of the cover film 41, and then the polarizing film and the touch sensor film are pasted in that order on a surface of the cover film 41 on the opposite side to the display circuit layer 20 with a bonding layer (not illustrated), for example. Further, at this time, the bending section 2 may be formed thinner than the non-bending section, or a hard coat layer may be formed by bonding, with a bonding layer (not illustrated), a hard coat film with a size equivalent to a size of each face of the flexible display 1 when the flexible display 1 is bent at the bending section 2. Furthermore, as a functional layer, the hard coat layer may be provided on the cover film 41, for example, separate from the bending section 2 and the through hole 3 to be finally formed by performing hard coat processing or the like on the surface of the cover film 41 excluding the bending section 2, for example. The above functional layer formation process (e.g., a bonding process) for the cover film 41 may be carried out at any timing before the formation of the through hole 3.

Thereafter, as illustrated in FIG. 8D, the through hole 3 passing through the flexible display 1 in the thickness direction is formed in the hole opening area 3A illustrated in FIG. 8C, thereby the flexible display 1 according to the present embodiment being manufactured.

Note that the method for forming the through hole 3 in the hole opening area 3A is not limited any specific one; that is, machining work such as Computer Numerical Control machining (CNC) work using a tool such as a drill, full etching processing by photolithography using an etching agent such as hydrofluoric acid, laser machining, or the like can be used.

In the case where the support film 12 is a motherboard as discussed before, for example, by performing singulation by cutting (dicing-cut) the motherboard at predetermined positions finally, individual flexible displays 1 can be obtained.

In the case where the cover body 40 is configured to include a polarizing film and a touch sensor film, pasting the polarizing film and the touch sensor film to the cover film 41 is carried out after, for example, the above-described dicing-cutting and terminal preparation, and the formation of the through hole 3 is carried out after the pasting of the polarizing film and touch sensor film to the cover film 41.

Advantageous Effects

As discussed above, in general, in the case where the flexible display is bent, in the case where the same portion thereof is bent two times or more while changing bending directions, the curvature becomes 0 (zero) at a fold center portion where the bending sections intersect with each other. As a result, a crack is generated in the flexible display, interior elements are crushed, or the like, thereby damaging the flexible display.

However, in the flexible display 1 according to the present embodiment, a portion where the curvature becomes zero does not exist because the through hole 3 is formed in the fold center portion where the bending sections 2 intersect with each other and the curvature becomes zero. With this, according to the present embodiment, the flexible display 1 can be folded in multiple directions in a manner in which the bending sections 2 intersect each other. This makes it possible for the large-area flexible display 1 to be compactly accommodated, carried, or the like.

Further, according to the present embodiment, because the organic EL element 24 facing the through hole 3 is sealed by the first inorganic film 26 and the second inorganic film 28, the organic EL element 24 can be protected from moisture, oxygen, and the like entering from the exterior even in a case where the through hole 3 is formed.

First Modification (Shape of Through Hole 3)

In the present embodiment, as illustrated in FIG. 1A, the case in which the through hole 3 has a precise circle shape in a plan view has been exemplified and mainly explained. However, the shape of the through hole 3 is not limited thereto.

Figure 9A:
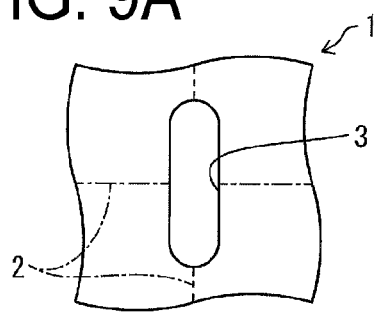
FIGS. 9A to 9C are plan views each illustrating another example of a through hole shape in the flexible display according to the first embodiment of the disclosure.
Figure 9B:
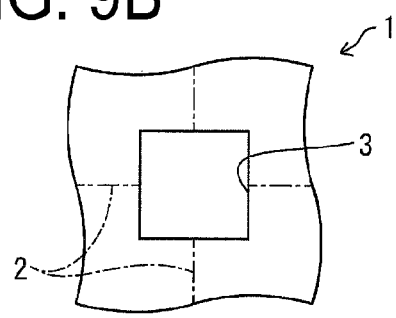
Figure 9C:
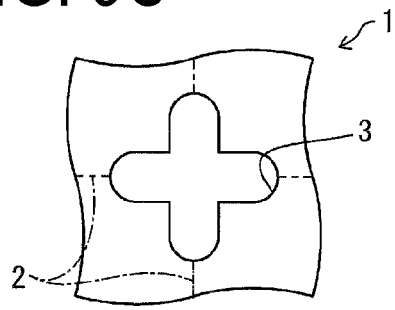

FIGS. 9A to 9C are plan views each illustrating another example of the shape of the through hole 3 in the flexible display 1 according to the present embodiment.

In a plan view, the through hole 3 may have an oval shape as illustrated in FIGS. 2A and 2B as well as FIG. 9A, or have a rectangular shape as illustrated in FIG. 9B. In addition, the through hole 3 may have a shape in which multiple ovals are superimposed with the axes thereof being shifted, that is, may have a cross shape as illustrated in FIG. 9C, for example.

As described above, the shape of the through hole 3 is not limited to any specific one. Note that, however, in a case where the through hole 3 includes corners, stress is likely to concentrate on the corners. Accordingly, repeatedly bending the flexible display 1 may raise a possibility of fatigue breakdown occurring on the corner where the stress is concentrated. As such, in order to prevent the stress concentration, it is preferable for the through hole 3 to be formed in a circular shape in a plan view, and is specifically preferable to be formed in a precise circle shape.

In the case where the through hole 3 is formed in an oval shape or a shape in which oval shapes are combined as illustrated in FIG. 9A or 9C, it is preferable for the through hole 3 to be provided that the longitudinal axis of the through hole 3 becomes parallel to the bending section 2 in order to make the axis direction of the oval be the bending direction.

Second Modification (Arrangement of Gate Driver GD and Source Driver SD)

Figure 10:
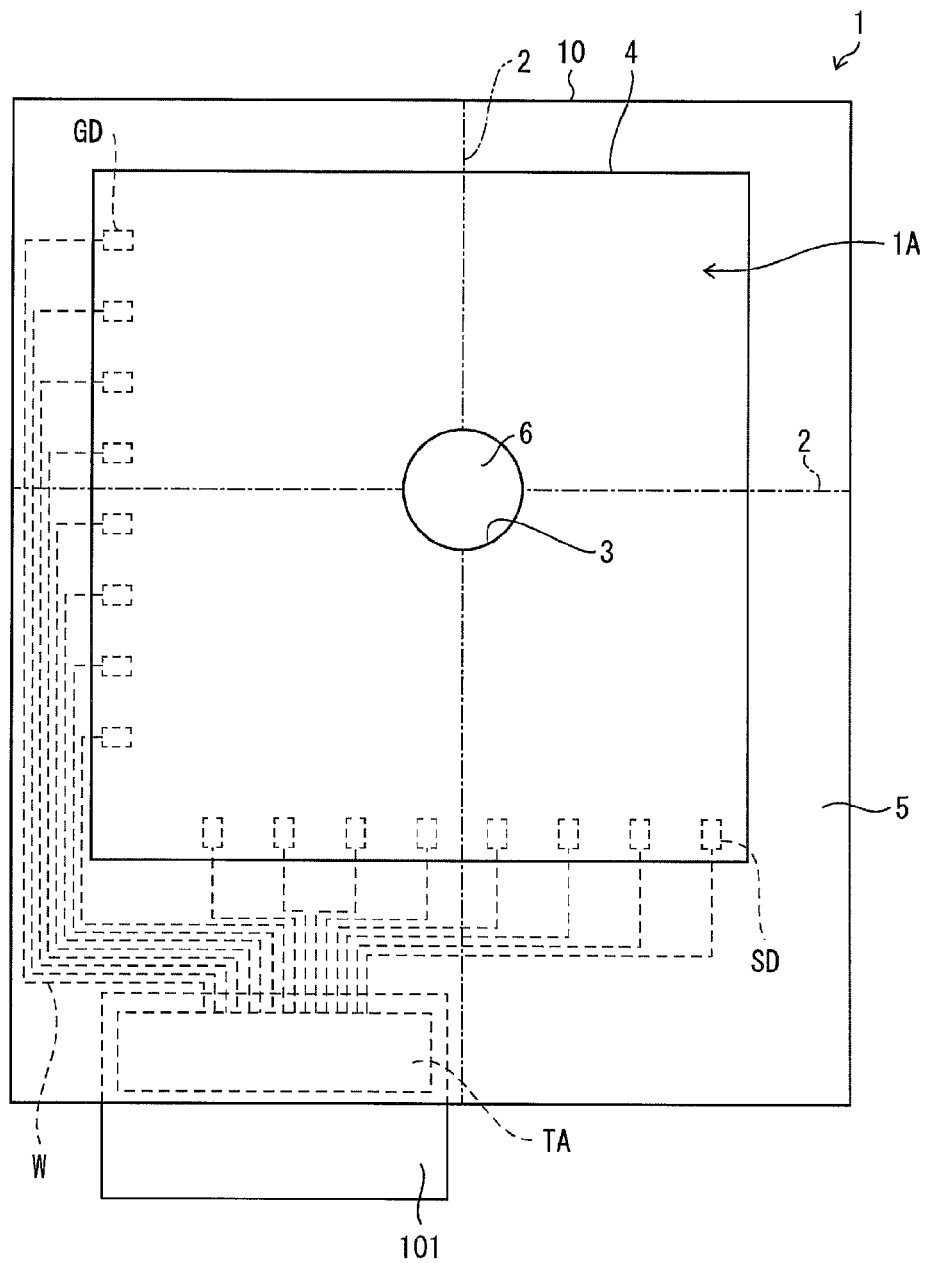
FIG. 10 is a perspective plan view illustrating an example of arrangement of a gate driver and a source driver of a flexible display according to a second modification on the first embodiment of the disclosure.

FIG. 10 is a perspective plan view illustrating an example of arrangement of a gate driver GD and a source driver SD of the flexible display 1 according to the present modification. In FIG. 10, constituent elements other than the support body 10, the gate driver GD, the source driver SD, wiring line W, the terminal section TA, and the FPC board 101 are omitted.

In FIG. 7, the case in which the gate driver GD and the source driver SD are provided in the frame region 5 on the support body 10 is cited as an example and illustrated. However, the present embodiment is not limited thereto.

For example, at least one of the gate driver GD and the source driver SD may be provided in the FPC board 101, and the FPC board 101 may be arranged on the opposite side to the display face 1a of the flexible display 1. Further, in the case where the flexible display 1 is a top-emitting type device, at least one of the gate driver GD and the source driver SD may be arranged on the opposite side to the display face 1a on the support body 10, as illustrated in FIG. 10, by forming a through hole or the like for distributing the wiring line to the support body 10 (e.g. the support film 12).

Accordingly, as illustrated in FIG. 10, it is not absolutely necessary for the gate driver GD and the source driver SD to be provided in the frame region 5, and they may be provided within the display region 4.

It is technically possible for the flexible display 1 to be bent with a small curvature radius (R) not greater than 1 mm, for example, even at a portion where the TFT 21, the wiring line 22, or the organic EL element 24 is formed; as illustrated in FIGS. 7 and 10, the sub pixel 7 may overlap with the bending section 2, and there arises no problem even in a case where the TFT 21, the wiring line 22, or the organic EL element 24 overlaps with the bending section 2.

Likewise, in the case where the gate driver GD and the source driver SD are formed on the support body 10, no problem is raised even in a case where the gate driver GD and the source driver SD overlap with the bending section 2. However, it is preferable that the gate driver GD and the source driver SD be formed separate from the bending section 2 within a range that does not affect the frame design or the like.

Meanwhile, in the case where the gate driver GD, the source driver SD, and circuits such as the display control circuit are formed on the FPC board 101, it is preferable that the FPC board 101 and the terminal section TA connecting the FPC board 101 be provided separate from the bending section 2.

Third Modification (Arrangement of Gate Driver GD)

In FIG. 7, the case in which the gate driver GD is provided in the frame region 5 adjacent to one side in the extension direction of each gate wiring line GL, is cited as an example and illustrated. However, the present embodiment is not limited thereto.

Figure 11:
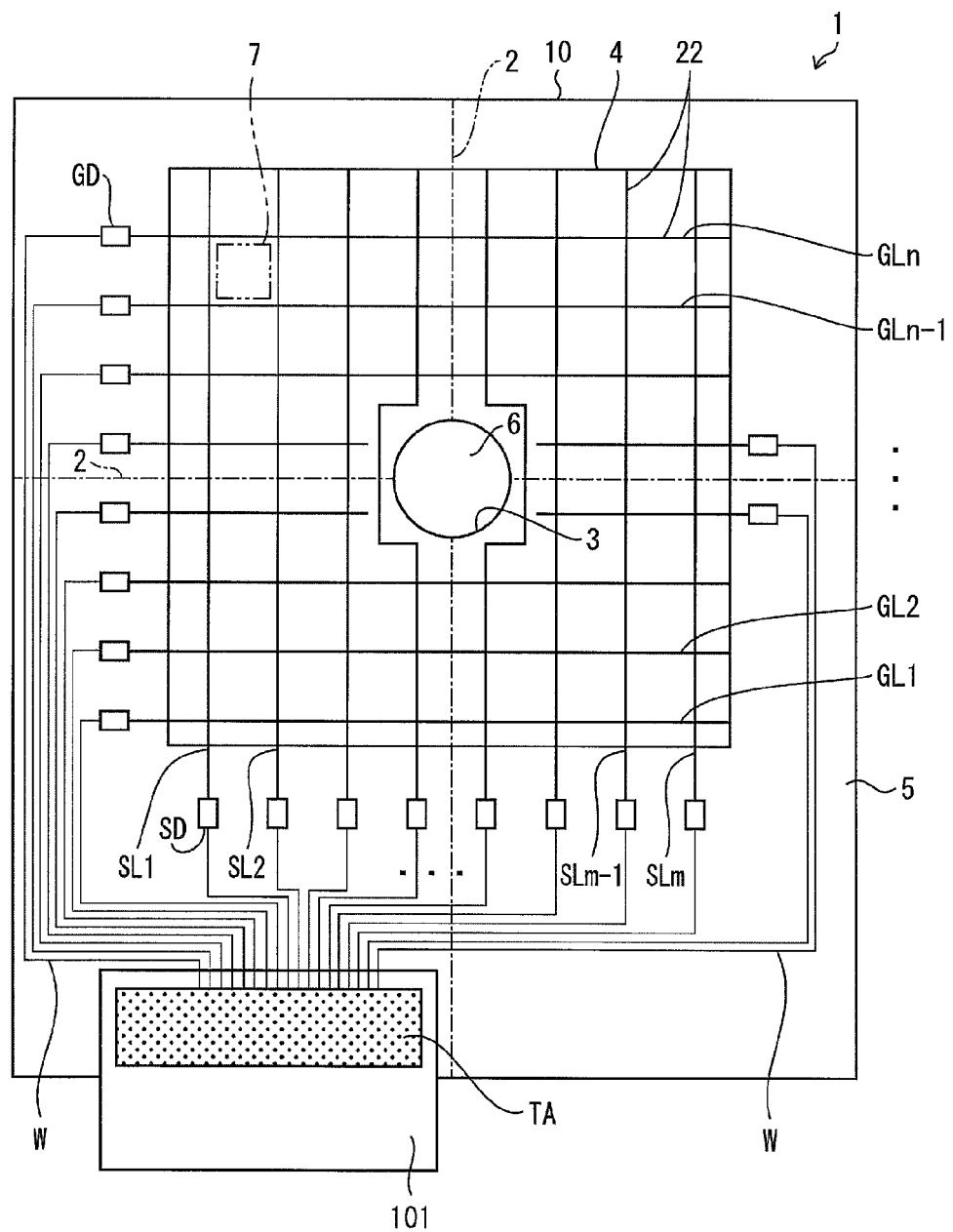
FIG. 11 is a plan view illustrating an example of arrangement of a gate driver and a source driver of a flexible display according to a third modification on the first embodiment of the disclosure.
Figure 12:
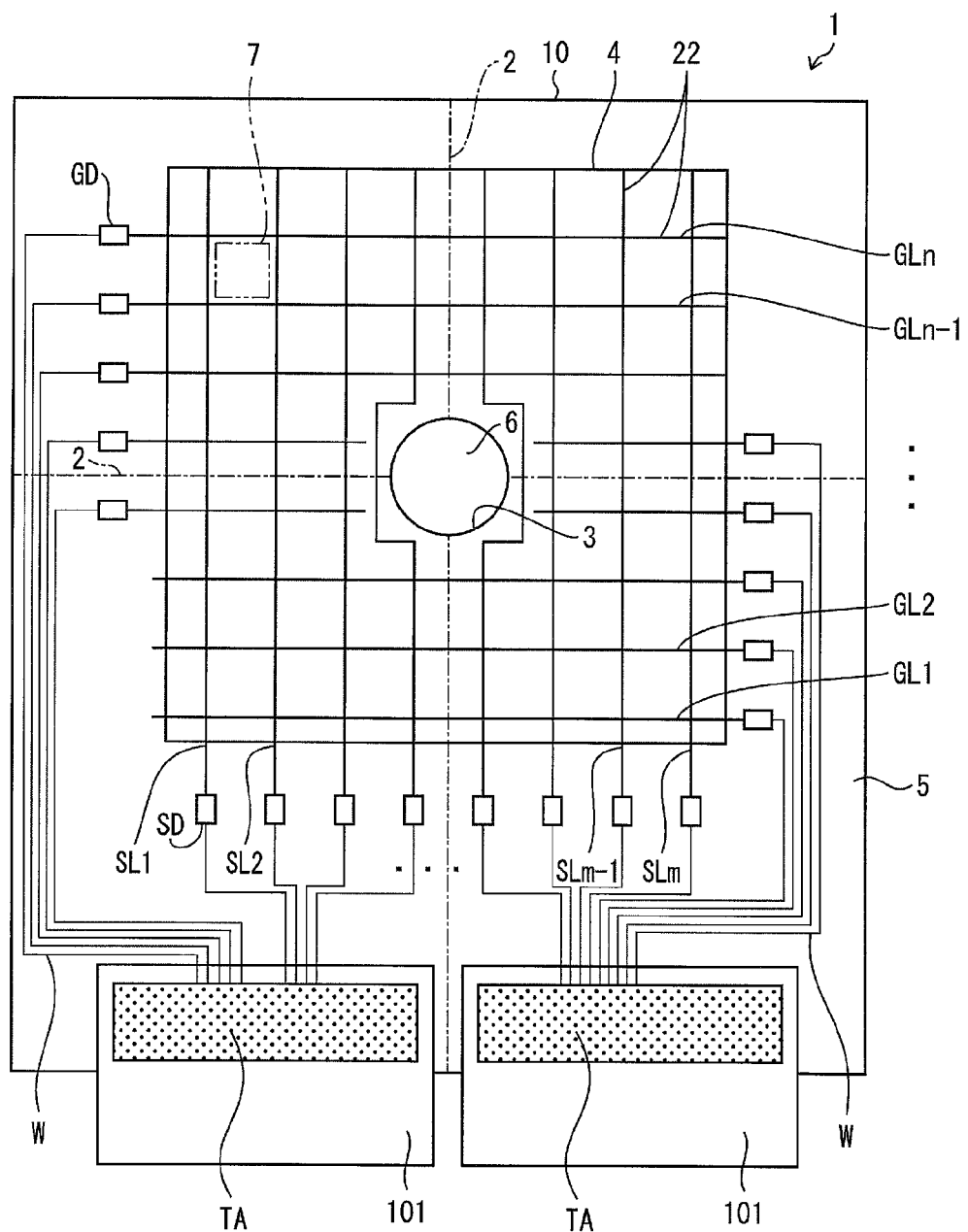
FIG. 12 is a plan view illustrating an example in which two terminal sections are provided in the flexible display according to the third modification on the first embodiment of the disclosure.

FIG. 11 and FIG. 12 are plan views each illustrating an example of arrangement of a gate driver GD and a source driver SD of the flexible display 1 according to the present modification. FIG. 11 illustrates an example in which a single terminal section TA is provided in the flexible display 1 according to the present modification. FIG. 12 illustrates an example in which two terminal sections TA are provided in the flexible display 1 according to the present modification. For the sake of convenience in illustration, some pieces of wiring line 22 are omitted in FIGS. 11 and 12. As such, for the sake of convenience in illustration, each of FIGS. 11 and 12 describes the plane size of the through hole 3 with a considerably larger scale than an actual scale with respect to the support body 10.

As illustrated in FIGS. 11 and 12, the flexible display 1 according to the present modification is such that the gate wiring line GL facing the through hole 3 is partitioned in the row direction with the through hole 3 interposed therebetween. Because of this, in the present modification, a gate driver GD different from the gate driver GD that is provided in the frame region 5 adjacent to one side in the extension direction of the partitioned gate wiring line GL, is provided in the frame region 5 adjacent to the other side in the extension direction (in other words, the row direction) of the partitioned gate wiring line GL relative to the display region 4.

The gate drivers GD are connected to each part of the gate wiring line GL partitioned in the row direction with the through hole 3 interposed therebetween. The gate drivers GD connected to each part of the gate wiring line GL partitioned in the row direction with the through hole 3 interposed therebetween are respectively connected to the terminal section TA through different wiring lines W.

FIGS. 11 and 12 each illustrate an example of a case in which one gate driver GD is connected to each part of the gate wiring line GL partitioned in the row direction with the through hole 3 interposed therebetween, and one gate driver GD is connected to each gate wiring line GL other than the partitioned gate wiring line GL. However, the present modification is not limited thereto.

For example, the gate drivers GD may respectively be provided in the frame region 5 on one side in the extension direction of the gate wiring line GL other than the partitioned gate wiring line GL and in the frame region 5 on the other side in the extension direction thereof.

As discussed above, in the case where the gate drivers GD are respectively provided, with the display region 4 interposed therebetween, in the frame region 5 on one side in the extension direction of each gate wiring line GL and in the frame region 5 on the other side in the extension direction thereof, the gate driver GD provided in the frame region on the one side and the gate driver GD provided in the frame region on the other side may respectively scan different gate wiring lines GL from each other or may scan the same gate wiring line GL together.

As described above, in FIG. 11, like FIG. 7, the case in which a single terminal section TA is provided in the flexible display 1 is cited as an example and illustrated. Note that, however, the present modification is also not limited thereto; as illustrated in FIG. 12, the terminal section TA may be provided being divided into two portions with the bending section 2 interposed therebetween so as not to overlap with the bending section 2.

In a case that a horizontally divided driving method is employed for driving the gate wiring line GL, the gate wiring line GL facing the through hole 3 is partitioned with the through hole 3 interposed therebetween without bypassing the through hole 3.

Each part of the gate wiring line GL partitioned with the through hole 3 interposed therebetween is electrically connected to a different gate driver GD provided in the frame region 5 to which each part of the above gate wiring line GL is extended, and is driven by the corresponding gate driver GD.

Fourth Modification (Arrangement of Source Driver SD)

FIGS. 11 and 12 each illustrate an example of a case in which the source wiring line SL facing the through hole 3 is formed bypassing the through hole 3 while the gate wiring line GL facing the through hole 3 is partitioned with the through hole 3 interposed therebetween. However, the present embodiment is not limited thereto.

Figure 13:
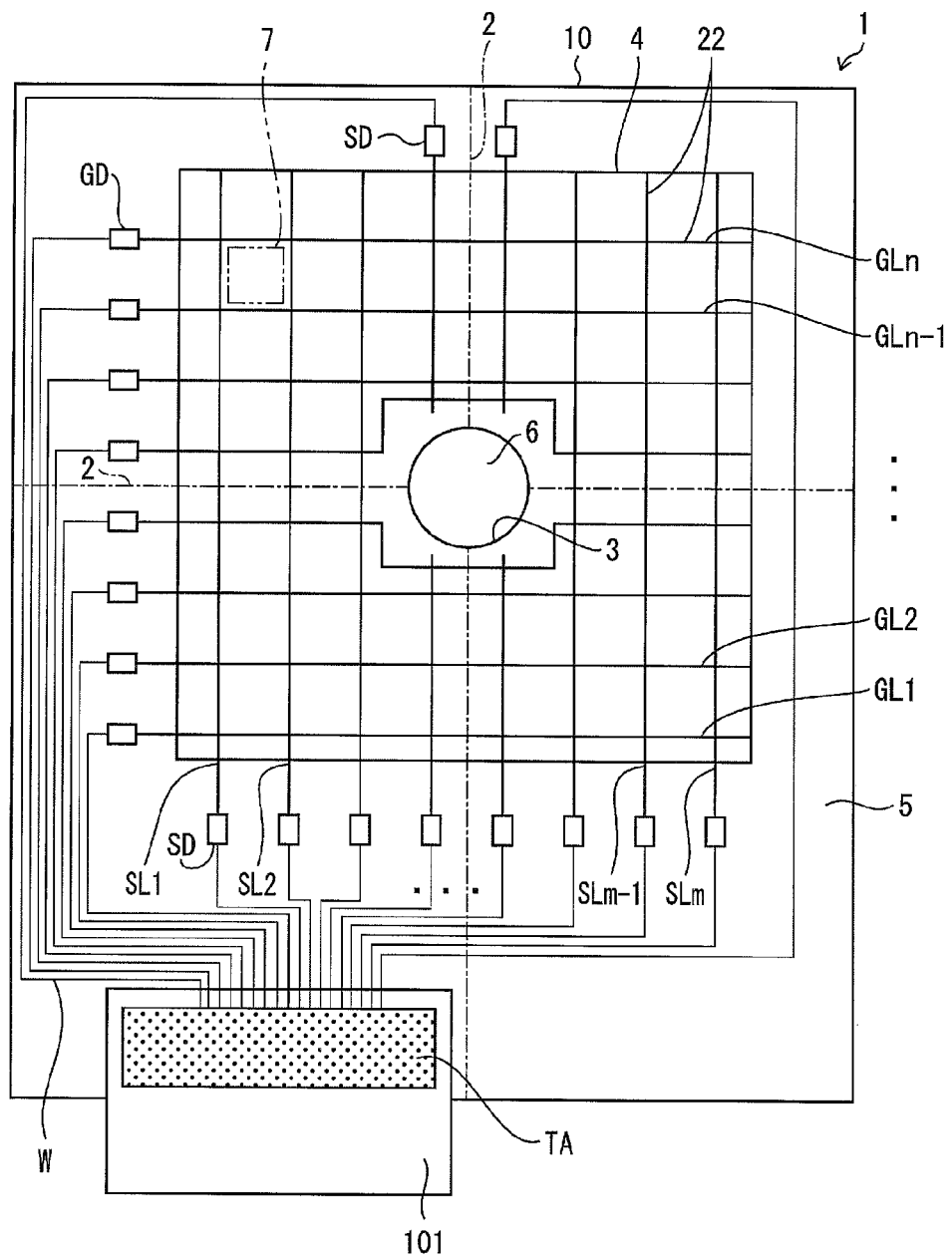
FIG. 13 is a plan view illustrating an example of a wiring line structure of a flexible display according to a fourth modification on the first embodiment of the disclosure.

FIG. 13 is a plan view illustrating an example of arrangement of a gate driver GD and a source driver SD of the flexible display 1 according to the present modification. FIG. 13 illustrates an example in which a single terminal section TA is provided in the flexible display 1 according to the present modification. However, also in the present modification, it goes without saying that the terminal section TA may be provided being divided into two portions with the bending section 2 interposed therebetween so as not to overlap with the bending section 2 in FIG. 13 in the manner as illustrated in FIG. 12.

For the sake of convenience in illustration, some of wiring lines 22 are also omitted in FIG. 13. As such, for the sake of convenience in illustration, FIG. 13 also describes the plane size of the through hole 3 with a considerably larger scale than an actual scale with respect to the support body 10.

As illustrated in FIG. 13, the flexible display 1 according to the present modification is such that the gate wiring line GL facing the through hole 3 is formed bypassing the through hole 3 while the source wiring line SL facing the through hole 3 is partitioned in the column direction with the through hole 3 interposed therebetween. Because of this, in the present modification, a source driver SD different from the source driver SD that is provided in the frame region 5 adjacent to one side in the extension direction of the partitioned source wiring line SL, is provided in the frame region 5 adjacent to the other side in the extension direction (in other words, the column direction) of the partitioned source wiring line SL relative to the display region 4.

The source drivers SD are connected to each part of the source wiring line SL partitioned in the column direction with the through hole 3 interposed therebetween. The source drivers SD connected to each part of the source wiring line SL partitioned in the column direction with the through hole 3 interposed therebetween, are respectively connected to the terminal section TA through different wiring lines W.

As discussed above, in the present modification, with the formation of the source wiring line SL bypassing the through hole 3, the source wiring line SL is partitioned at the through hole 3 without distributing the source wiring line SL within the display region 4, and the source driver SD connected to the source wiring line SL that is partitioned by the through hole 3 and is positioned on the opposite side to the terminal section TA with the through hole 3 interposed therebetween is connected to the terminal section TA by distributing the wiring line W connected to the source driver SD in the frame region 5 in the periphery of the display region 4. That is, in the present modification, the source wiring line SL partitioned at the through hole 3 is distributed by the wiring line W in the frame region 5, which is a non-display region, to reach the terminal section TA.

FIG. 13 illustrates an example of a case in which one source driver SD is connected to each part of the source wiring line SL partitioned in the column direction with the through hole 3 interposed therebetween, and one source driver SD is connected to each source wiring line SL other than the partitioned source wiring line SL. However, the present modification is not limited thereto.

For example, the source drivers SD may respectively be provided in the frame region 5 on one side in the extension direction of the source wiring line SL other than the partitioned source wiring line SL and in the frame region 5 on the other side in the extension direction thereof.

Moreover, there may be provided two source drivers SD with the bending section 2 interposed therebetween, and multiple source wiring lines SL may be connected to a single source driver SD. In the example illustrated in FIG. 13, each part of the source wiring line SL partitioned with the through hole 3 interposed therebetween is electrically connected to a different source driver SD provided in the frame region 5 to which each part of the above source wiring line SL is extended, and is driven by the corresponding source driver SD. Note that, however, by connecting multiple source wiring lines SL to a single source driver SD, each part of the source wiring line SL partitioned with the through hole 3 interposed therebetween may be driven by the same source driver SD.

Fifth Modification (Arrangement of Gate Driver GD and Source Driver SD)

Figure 14:
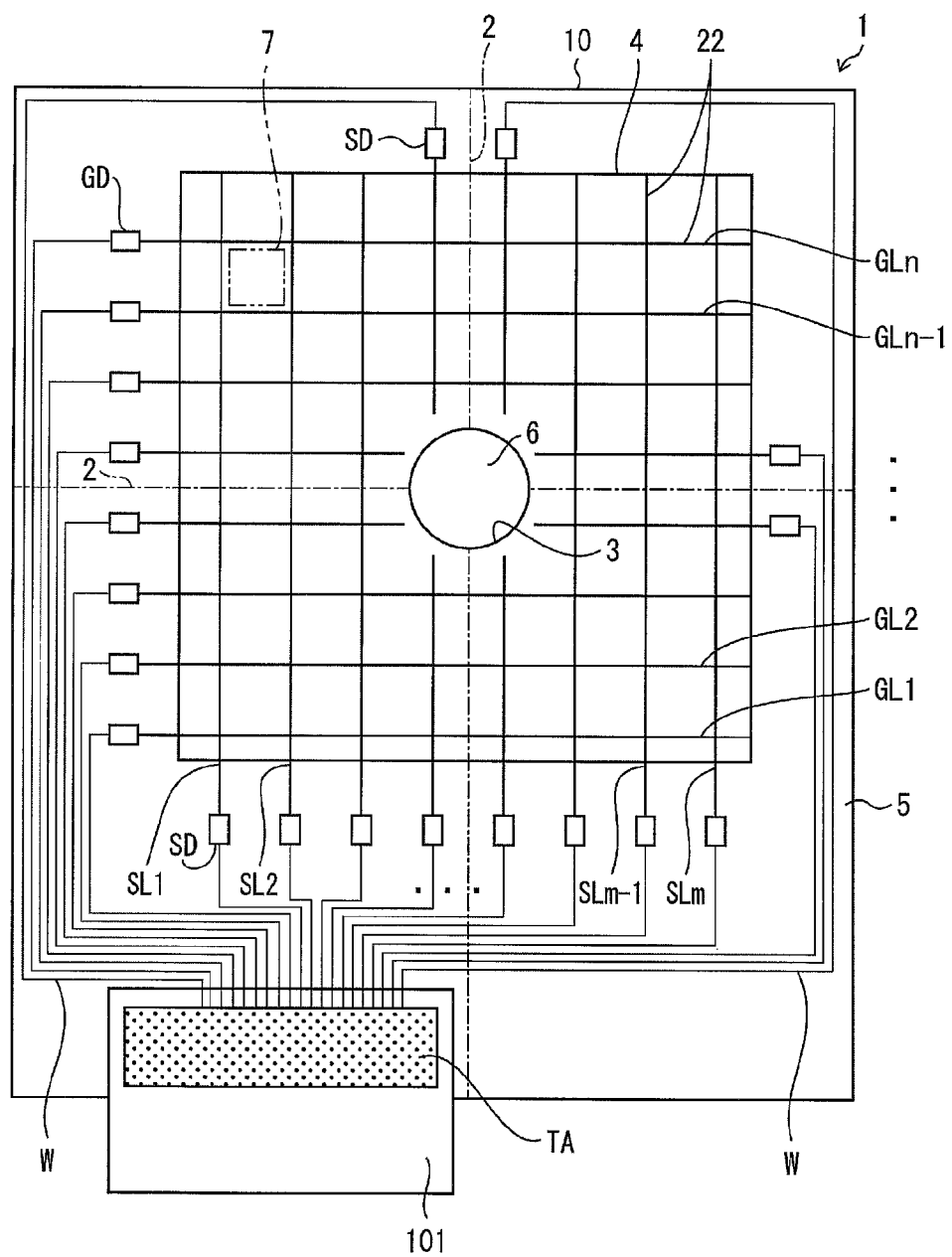
FIG. 14 is a plan view illustrating an example of a wiring line structure of a flexible display according to a fifth modification on the first embodiment of the disclosure.

FIG. 14 is a plan view illustrating an example of arrangement of a gate driver GD and a source driver SD of the flexible display 1 according to the present modification. FIG. 14 illustrates an example in which a single terminal section TA is provided in the flexible display 1 according to the present modification. However, also in the present modification, it goes without saying that the terminal section TA may be provided being divided into two portions with the bending section 2 interposed therebetween so as not to overlap with the bending section 2 in FIG. 14 in the manner as illustrated in FIG. 12.

For the sake of convenience in illustration, some of the wiring lines 22 are also omitted in FIG. 14. As such, for the sake of convenience in illustration, FIG. 14 also describes the plane size of the through hole 3 with a considerably larger scale than an actual scale with respect to the support body 10.

As illustrated in FIG. 14, the flexible display 1 according to the present modification is such that the gate wiring line GL facing the through hole 3 is partitioned in the row direction with the through hole 3 interposed therebetween and the source wiring line SL facing the through hole 3 is also partitioned in the column direction with the through hole 3 interposed therebetween. Further, in the present modification, a gate driver GD different from the gate driver GD that is provided in the frame region 5 adjacent to one side in the extension direction of the partitioned gate wiring line GL is provided in the frame region 5 adjacent to the other side in the extension direction (in other words, the row direction) of the partitioned gate wiring line GL relative to the display region 4, and a source driver SD different from the source driver SD that is provided in the frame region 5 adjacent to one side in the extension direction of the partitioned source wiring line SL is provided in the frame region 5 adjacent to the other side in the extension direction (in other words, the column direction) of the partitioned source wiring line SL relative to the display region 4.

The gate drivers GD are connected to each part of the gate wiring line GL partitioned in the row direction with the through hole 3 interposed therebetween. The gate drivers GD connected to each part of the gate wiring line GL partitioned in the row direction with the through hole 3 interposed therebetween, are respectively connected to the terminal section TA through different wiring lines W.

Further, the source drivers SD are connected to each part of the source wiring line SL partitioned in the column direction with the through hole 3 interposed therebetween. The source drivers SD connected to each part of the source wiring line SL partitioned in the column direction with the through hole 3 interposed therebetween, are respectively connected to the terminal section TA through different wiring lines W.

In this manner, both the gate wiring line GL and the source wiring line SL may be partitioned with the through hole 3 interposed therebetween.

FIG. 14 illustrates an example of a case in which one gate driver GD is connected to each gate wiring line GL other than the partitioned gate wiring line GL, and one source driver SD is connected to each source wiring line SL other than the partitioned source wiring line SL. However, the present modification is not limited thereto. Obviously, modifications similar to the third and fourth modifications can be carried out, and these modifications can be appropriately combined.

Sixth Modification (Arrangement and Wiring Line Structure of Gate Driver GD)

Figure 15:
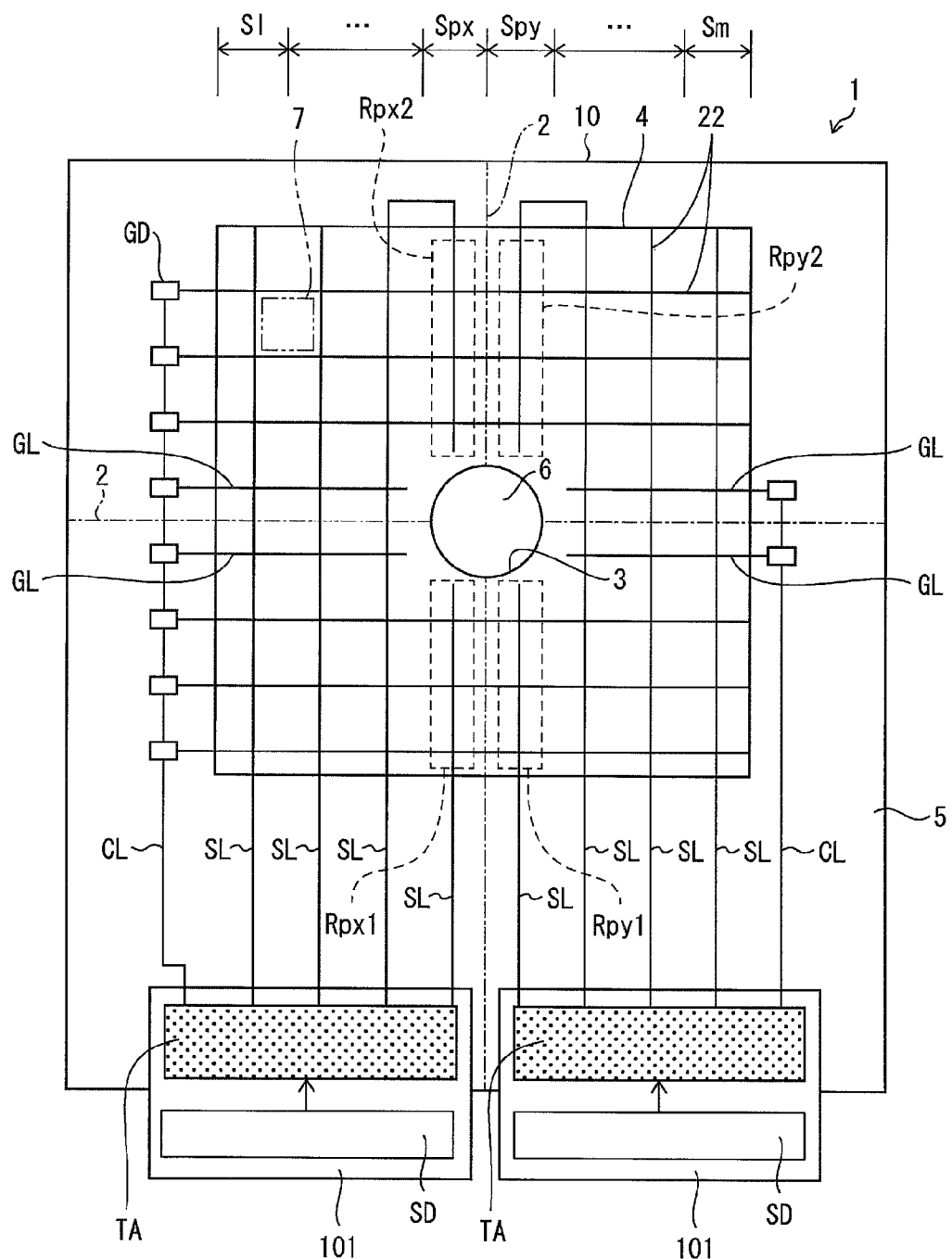
FIG. 15 is a plan view illustrating an example of a wiring line structure of a flexible display according to a sixth modification on the first embodiment of the disclosure.

FIG. 15 is a plan view illustrating an example of a wiring line structure of the flexible display 1 according to the present modification. For the sake of convenience in illustration, some pieces of wiring line 22 are omitted in FIG. 15. As such, for the sake of convenience in illustration, FIG. 15 describes the plane size of the through hole 3 with a considerably larger scale than an actual scale with respect to the support body 10.

Hereinafter, FIG. 15 illustrates an example of a case in which a source driver SD is provided on the FPC board 101. However, the present modification is not limited thereto. Further, although a case in which there are provided two terminal sections TA with the bending section 2 interposed therebetween so as not to overlap with the bending section 2 is cited as an example and illustrated in the present modification, it may be sufficient that one terminal section TA is provided as described before.

As illustrated in FIG. 15, the flexible display 1 according to the present modification is such that the gate wiring line GL facing the through hole 3 is partitioned in the row direction with the through hole 3 interposed therebetween and the source wiring line SL facing the through hole 3 is also partitioned in the column direction with the through hole 3 interposed therebetween.

Each part of the partitioned gate wiring line GL is connected to a gate driver GD. Because of this, also in the present modification, a gate driver GD different from the gate driver GD that is provided in the frame region 5 adjacent to one side in the extension direction of the partitioned gate wiring line GL, is provided in the frame region 5 adjacent to the other side in the extension direction (in other words, the row direction) of the partitioned gate wiring line GL relative to the display region 4. One gate driver GD is connected to each gate wiring line GL other than the partitioned gate wiring line GL.

In the present modification, the gate drivers GD respectively connected to the gate wiring lines GL of the rows adjacent to each other, are connected to each other by wiring lines CL extended in the column direction from the terminal section TA.

Of the source wiring lines SL facing the through hole 3 (in other words, the source wiring lines SL partitioned by the through hole 3), the source wiring line SL positioned on the opposite side to the terminal section TA with the through hole 3 interposed therebetween is drawn once from the display region 4 to the frame region 5, and is made to return to the display region 4 again, whereby the source wiring line SL is distributed to the terminal section TA passing through the display region 4.

To rephrase, in the present modification, the source wiring line SL of a column where the through hole 3 is not formed is distributed to the frame region 5 positioned on the opposite side to the terminal section TA with the through hole 3 interposed therebetween, and is made to return to a column where the through hole 3 is formed, whereby the source wiring line SL is formed in the display region 4 on the opposite side to the terminal section TA with the through hole 3 interposed therebetween.

More detailed description follows. In the present modification, multiple source wiring lines SL extended in the column direction are formed in each column of the flexible display 1. The source wiring lines SL are arranged parallel to each other in a stripe form within the display region 4.

Here, as illustrated in FIG. 15, in a column Spx where the through hole 3 is formed, when the display region 4 positioned on the terminal section TA side with the through hole 3 interposed therebetween is taken as a region Rpx1, and the display region 4 positioned on the opposite side to the region Rpx1 with the through hole 3 interposed therebetween (to rephrase, the display region 4 positioned on the opposite side to the terminal section TA with the through hole 3 interposed therebetween) is taken as a region Rpx2, the source wiring line SL of the region Rpx1 in the column Spx and the source wiring line SL of the region Rpx2 in the column Spx are partitioned by the through hole 3 and are not connected to each other.

The source wiring line SL of the region Rpx1 in the column Spx is linearly formed in parallel to the source wiring lines SL in other columns.

Meanwhile, in the region Rpx2 in the column Spx, there is formed the source wiring line SL that is formed in a column, other than the column Spx, where the through hole 3 is not formed (e.g., a column adjacent to the column Spx), is drawn to the frame region 5 on the opposite side to the terminal section TA with the display region 4 interposed therebetween, and is so distributed as to return to the region Rpx2.

Because of this, data signals are supplied to the region Rpx1 in the column Spx from the source driver SD side along a scanning direction of the gate wiring line GL; meanwhile, data signals are supplied to the region Rpx2 from the frame region 5 side on the opposite side to the source driver SD with the display region 4 interposed therebetween through the source wiring line SL, distributed to the region Rpx2, of a column, other than the column Spx, where the through hole 3 is not formed (e.g., a column adjacent to the column Spx).

As such, the source driver SD sends, to the source wiring line SL in the region Rpx2, data signals rearranged so that the data corresponding to the scanning order of the gate wiring lines in the region Rpx2 are written into the respective rows of the gate wiring lines GL in the region Rpx2.

Likewise, in another column Spy where the through hole 3 is formed, when the display region 4 positioned on the terminal section TA side with the through hole 3 interposed therebetween is taken as a region Rpy1, and the display region 4 positioned on the opposite side to the region Rpy1 with the through hole 3 interposed therebetween is taken as a region Rpy2, "column Spx", "region Rpx1", and "region Rpx2" can respectively read "column Spy", "region Rpy1", and "region Rpy2" in the above description.

According to the present modification, the gate drivers GD respectively connected to the gate wiring lines GL of the rows adjacent to each other, are connected to each other by wiring lines CL extended in the column direction from the terminal section TA. Because of this, according to the present modification, unlike the case of the above-described third or fifth modification, for example, the wiring line W connected to the respective gate drivers GD formed in each portion of the frame region 5 opposing each other in the row direction with the display region 4 interposed therebetween is not required to be distributed to the terminal section TA in each portion of the frame region 5 mentioned above. As such, according to the present modification, frame narrowing can be performed on each portion of the frame region 5 mentioned above to make them narrower than the case of the third or fifth modification.

Note that the present modification is not limited thereto, and the gate drivers GD may be connected to the terminal section TA by the wiring line W like in the case of the third or fifth modification.

In the present modification, the source wiring line SL of the column where the through hole 3 is not formed is distributed to the frame region 5 positioned on the opposite side to the terminal section TA with the through hole 3 interposed therebetween, and then is made to return to the column where the through hole 3 is formed. Because of this, according to the present modification, unlike the case of the fourth or fifth modification, it is unnecessary that the source wiring line SL partitioned by the through hole 3 is distributed in the frame region 5 to be connected to the terminal section TA by the wiring line W from a side (frame region 5) on the opposite side to a side (frame region 5) where the terminal section TA is formed, to the terminal section TA so as to bypass the display region 4 in the flexible display 1. As such, according to the present modification, frame narrowing can be performed on the side where the terminal section TA is formed and the side on the opposite side to the above side to make these sides narrower than the case of the fourth or fifth modification.

Although, in FIG. 15, the case in which the gate driver GD is formed in the frame region 5 is cited as an example and illustrated, the gate driver GD may be formed in the display region 4. By connecting the multiple gate drivers GD with the wiring line CL as described above, the gate drivers GD can be arranged in the display region 4, and can be electrically connected to the terminal section TA without distributing, in the frame region 5, the wiring line 22 (e.g., the wiring line W or wiring line CL) connecting the gate drivers GD and the terminal section TA. Because of this, arranging the gate drivers GD in the display region 4 makes it possible to perform frame narrowing on the sides except the side where the terminal section TA is provided. As such, the shape of the frame region 5 and the shape of the display region 4 can be freely designed, and design properties can be enhanced. As a result, the degree of freedom in design of the support body 10 or the like can be increased, and the degree of freedom in design of the flexible display 1 or the like can be increased.

In addition, by arranging the gate drivers GD in the display region 4 in the manner as discussed above, in the case where, for example, multiple through holes 3 are provided in the row direction as illustrated in FIG. 3B, or in a case where multiple slits are provided in the row direction as described in an embodiment to be explained later, a gate wiring line partitioned by the through holes 3 adjacent to each other in the row direction or by the slits adjacent to each other in the row direction (that is, a gate wiring line positioned between the through hole 3 adjacent to each other in the row direction or between the slits adjacent to each other in the row direction) can be driven by the gate driver GD arranged in the display region 4.

Seventh Modification (Display Circuit Layer 20)

In the present embodiment, the case in which the flexible display 1 is an organic EL display device and the organic EL element 24, for example, is provided as a light emitting element (electro-optic element) in the display circuit layer 20, is cited and explained. However, the present embodiment is not limited thereto.

The flexible display 1 is not limited to any specific one as long as it is a display device flexible and bendable. As such, the flexible display 1 may be an EL display such as an organic EL display in which the display circuit layer 20 includes an Organic Light Emitting Diode (OLED) as the electro-optic element or an inorganic EL display in which the display circuit layer 20 includes an inorganic light emitting diode as the electro-optic element, or may be a Quantum dot Light Emitting Diode (QLED) display in which the display circuit layer 20 includes QLED as the electro-optic element, for example. Further, the above-discussed flexible display 1 may be a liquid crystal display in which the display circuit layer 20 includes a liquid crystal display element as the electro-optic element, or may be electronic paper in which the display circuit layer 20 includes an electrophoretic element as the electro-optic element.

Second Embodiment

Figure 16:
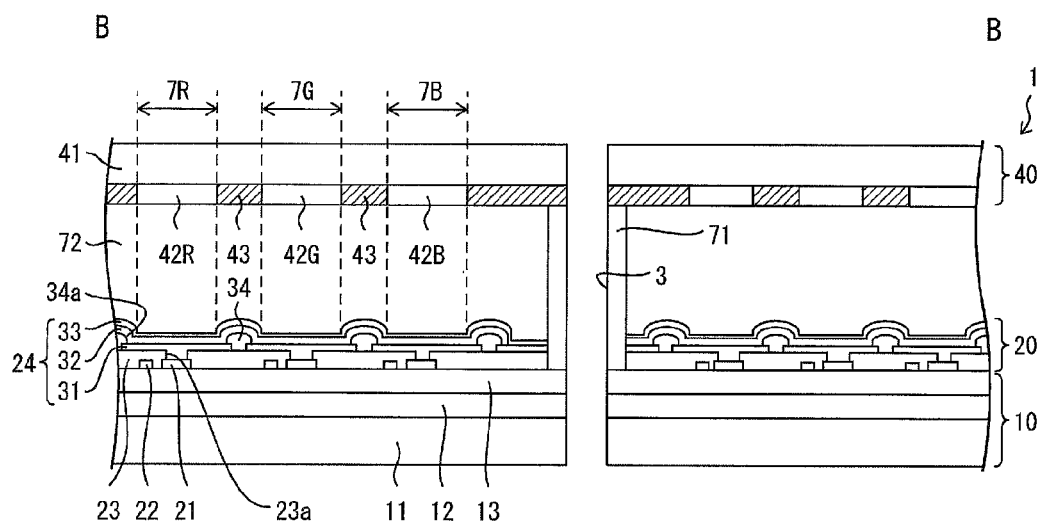
FIG. 16 is an end view illustrating an example of a schematic configuration of a major portion of a flexible display according to a second embodiment of the disclosure.

A description follows regarding the present embodiment, with reference to FIGS. 16 to 17D. The present embodiment will be stated by the differences between the present embodiment and the first embodiment, and components having the same functions as the components used in the first embodiment are appended with the same reference signs, and the description thereof is omitted.

The present embodiment will also be described while exemplifying a case in which a flexible display according to the present embodiment is an organic EL display device like in the first embodiment.

In the first embodiment, described is an example of the case in which, in order to seal the organic EL element 24 between the sealing film 25 and the support body 10, the sealing film 25 in which the first inorganic film 26, the organic film 27, and the second inorganic film 28 are layered in that order from the second electrode 33 side is provided on the second electrode 33 to cover the organic EL element 24, the organic film 27 is not provided on the periphery of the through hole 3, and the second inorganic film 28 is provided in contact with the first inorganic film 26.

Note that, however, a cross section structure (in other words, a sealing structure of the through hole 3) of the flexible display 1 according to the present embodiment is not limited to the structure illustrated in FIG. 6 in the first embodiment.

FIG. 16 is an end view illustrating an example of a schematic configuration of a major portion of the flexible display 1 according to the present embodiment. FIG. 16 illustrates an example of a schematic configuration of the periphery of the through hole 3 of the flexible display 1 according to the present embodiment. FIG. 16 corresponds to an end view of the flexible display illustrated in FIG. 1A when taken along the B-B line. Because an end view of the flexible display illustrated in FIG. 1A when taken along the C-C line is the same as FIG. 16 except that the through hole 3 and a dam material 71 illustrated in FIG. 16 are not provided, the illustration thereof is omitted herein.

The flexible display 1 according to the present embodiment has a dam and fill structure as illustrated in FIG. 16.

In the flexible display 1 according to the present embodiment, the display circuit layer 20 is provided on the support body 10, and the dam material 71 and a filling material 72 are provided in place of the sealing film 25, as illustrated in FIG. 16.

In addition, as color filter (CF) layers 42, for example, a red CF layer 42R transmitting red light, a green CF layer 42G transmitting green light, and a blue CF layer 42B transmitting blue light are provide corresponding to the sub pixels 7 on an opposing surface side of the cover film 41 against the display circuit layer 20 so as to cover the upper side of the organic EL elements 24 of the respective sub pixels 7. A black matrix (BM) 43 is provided in each boundary portion between the CF layers 42 adjacent to each other. With this, the light emitted from the organic EL element 24 of the respective sub pixels 7 passes through the red CF layer 42R, the green CF layer 42G, and the blue CF layer 42B, whereby red light, green light, and blue light are emitted corresponding to the red sub pixel 7R, the green sub pixel 7G, and the blue sub pixel 7B.

In the present embodiment, the organic EL layer 32 including the light emitting layer is vapor-deposited on the entire display region 4, and the red CF layer 42R, the green CF layer 42G, and the blue CF layer 42B, for example, are provided as the CF layers 42 for each sub pixel 7 as discussed above.

In this case, the organic EL element 24 may be such that a light emitting layer whose light emission color is white is vapor-deposited on the entire display region 4 and may emit white light in response to a voltage between the first electrode 31 and the second electrode 33, and may realize full color image display by passing the above white color through the red CF layer 42R, the green CF layer 42G, and the blue CF layer 42B provided in the respective sub pixels 7.

Further, the organic EL element 24 may be such that light emitting layers whose light emission colors are respectively red, green, and blue are vapor-deposited on the entire display region 4, the first electrode 31 has a layered structure in which a reflective electrode and a transparent electrode are layered in that order from the support body 10 side, and red light, green light, and blue light are respectively emitted by changing an optical path length between the reflective electrode of the first electrode 31 and the second electrode 33 of each sub pixel 7 in the respective sub pixels 7, or may be such that red light, green light, and blue light emitted from the organic EL element 24 pass through any one of the red CF layer 42R, the green CF layer 42G, and the blue CF layer 42B, corresponding to the respective light emission colors, which are provided in the respective sub pixels 7.

FIG. 16 illustrates, as an example of the organic EL element 24, an example of the case in which the organic EL element 24 emits light of white color, for example, by the organic EL layer 32 including the light emitting layer being vapor-deposited on the entire display region 4, as discussed before. However, the organic EL element 24 is not limited thereto, and it is needless to say that the organic EL element 24 may be an organic EL element of the selective RGB application system as discussed in the first embodiment.

Although FIG. 16, like FIG. 6A, illustrates an example of a case in which the second electrode 33 is a shared electrode provided to be shared by all the sub pixels 7, the second electrode 33 may be a pattern electrode formed in an island-like shape for each sub pixel 7, and the second electrodes 33 each patterned in the island-like shape may be connected to each other by auxiliary wiring lines (not illustrated) or the like.

The dam material 71 seals the filling material 72, and is provided as a sealing material between the support body 10 and the cover body 40 (in the example illustrated in FIG. 16, between the support body 10 and the BM 43 provided on a surface of the cover body 40).

As illustrated in FIG. 16, the dam material 71 is formed in a ring shape, for example, on the periphery of the through hole 3 to surround the through hole 3, and is also formed in a frame shape (not illustrated), for example, in the frame region 5 along a circumference of the display region 4 to surround the display region 4.

The filling material 72 is provided to fill a region that is surrounded by the dam material 71 formed to surround the through hole 3, the dam material 71 provided in the frame region 5 to surround the display region 4, the organic EL element 24 provided on the support body 10, and the cover body 40.

Various types of well-known dam materials having moisture prevention properties can be used for the dam material 71. Various types of well-known filling materials can be used for the filling material 72. As the filling material 72, a material with low moisture permeation properties, a material including a drying agent, an oxygen absorbent or the like, or the like may be used.

In a case of the filling material 72 of a curing type being used, in a case where reliability can be secured by the stated filling material 72 sufficiently preventing moisture, oxygen, and the like from entering into the organic EL element 24, the dam material 71 may be omitted.

Also in the present embodiment, as illustrated in FIG. 16, the through hole 3 is provided passing through the flexible display 1 in the thickness direction.

Because of this, in the display circuit layer 20, as illustrated in FIG. 16, elements such as the TFT 21 and the organic EL element 24, and the wiring line 22 such as the gate wiring line GL and the source wiring line SL in the periphery of the through hole 3 are formed separate from the through hole 3 and the dam material 71.

Manufacturing Method for Flexible Display 1

A manufacturing method for the flexible display 1 will be described next.

FIGS. 17A to 17D are end views illustrating an example of a manufacturing method for the flexible display 1 in the order of processes according to the present embodiment. Note that FIGS. 17A to 17D each illustrate an end face corresponding to an end face taken by cutting the flexible display 1 along the B-B line illustrated in FIG. 1.

In the present embodiment, like the first embodiment, the support film 12 and the barrier layer 13 are formed first on the carrier substrate 61, as illustrated in FIG. 17A.

Subsequently, on the barrier layer 13, the TFT 21, the wiring line 22, the flattening film 23, the first electrode 31, the edge cover 34, the organic EL layer 32, and the second electrode 33 are formed in that order as the display circuit layer 20 in a region corresponding to the display region 4 of each individual flexible display 1 (e.g., an organic EL display device) using the well-known method. However, in the present embodiment, the TFT 21, the wiring line 22, the flattening film 23, the first electrode 31, the edge cover 34, the organic EL layer 32, and the second electrode 33 are formed separate from the hole opening area 3A, which is a through hole formation-planned region, and its peripheral region surrounding the hole opening area 3A with a constant width where the dam material 71 is disposed.

With this, a first substrate is prepared in which the organic EL element 24 is formed.

Meanwhile, the cover film 41 is formed on a carrier substrate 62 which is similar to the carrier substrate 61. The cover film 41 can be formed using the same material and the same method as those of the support film 12.

Next, film formation of a resin or the like containing a chrome thin film or black pigment is performed on the cover film 41, and thereafter patterning is performed using a photolithographic method to form the BM 43. Subsequently, patterns of the CF layers 42 of respective colors, such as the red CF layer 42R, green CF layer 42G, and blue CF layer 42B, are formed in the gaps between the BMs 43 using a pigment dispersing method or the like. At this time, the BM 43 is formed in the hole opening area 3A and its peripheral region. The CF layer 42 and the BM 43 may be formed in the entire display region 4, or may be formed separate from the formation region of the dam material 71. With the above, a second substrate in which the CF layer 42 and the BM 43 are formed is prepared on the cover film 41.

Next, the dam material 71 as a sealing material and the filling material 72 as a filling material are applied to one of the first substrate and the second substrate. The dam material 71 and the filling material 72 can be applied by using a well-known method such as screen printing or the like. In addition, for the application of the dam material 71, the application (drawing) by a dispenser can be used. The dam material 71 is applied to a region surrounding the display region 4 of each individual flexible display 1, and is also applied to the hole opening area 3A, which is a through hole formation-planned region, and its peripheral region (that is, a region surrounding the hole opening area 3A with a constant width).

Subsequently, the first substrate and the second substrate are bonded with the dam material 71 and the filling material 72 interposed there between under an inactive gas atmosphere, and of the dam material 71 and filling material 72, at least the dam material 71 is cured. With this, as illustrated in FIG. 17A, the display circuit layer 20 including the organic EL element 24 is sealed between the support film 12, to become the support body 10, where the barrier layer 13 is provided and the cover film 41, to become the cover body 40, where the CF layer 42 and the BM 43 are provided.

Thereafter, as illustrated in FIG. 17B, a laser beam is radiated from the carrier substrate 61 side onto an interface between the carrier substrate 61 and the support film 12 to cause ablation, whereby the carrier substrate 61 is peeled at the interface; further, a laser beam is radiated from the carrier substrate 62 side onto an interface between the carrier substrate 62 and the cover film 41 to cause ablation, whereby the carrier substrate 62 is peeled at the interface.

Any of the peeling of the carrier substrate 61 and the peeling of the carrier substrate 62 may be carried out earlier than the other one.

Although, in the example illustrated in FIG. 17B, the case in which the carrier substrates 61 and 62 are peeled by ablation peeling is cited as an example and explained, a peeling layer may be used for peeling the carrier substrates 61 and 62. For the peeling of the carrier substrates 61 and 62 using the peeling layer, the same method as that for the peeling of the carrier substrate 61 using the peeling layer in the first embodiment can be adopted.

Next, as illustrated in FIG. 17C, the rear-surface film 11 is bonded to a surface of the support film 12 on the opposite side to the display circuit layer 20 in the same manner as the first embodiment, and thereafter, as illustrated in FIG. 17D, the through hole 3 passing through the flexible display 1 in the thickness direction is formed in the hole opening area 3A illustrated in FIG. 17C, thereby manufacturing the flexible display 1 according to the present embodiment.

The method for dicing-cut when the support film 12 is a motherboard and the method for forming the through hole 3 when the cover body 40 includes a polarizing film and a touch sensor film or when the cover body 40 includes a hard coat layer, or the like are the same as the first embodiment.

Advantageous Effects

According to the present embodiment, like the first embodiment, the through hole 3 is formed at the fold center portion where the bending sections 2 intersect with each other, thereby making it possible to obtain the same effect as that of the first embodiment. Further, according to the present embodiment, because the organic EL element 24 facing the through hole 3 is sealed by, for example, the dam material 71, the organic EL element 24 can be protected from moisture, oxygen, and the like entering from the exterior even if the through hole 3 is formed.

Third Embodiment

A description follows regarding the present embodiment, with reference to FIGS. 18 to 20B. The present embodiment will be stated by the differences between the present embodiment and the first and second embodiments. Components having the same functions as the components stated in the first and second embodiments are appended with the same reference signs, and the description thereof is omitted.

Figure 18:
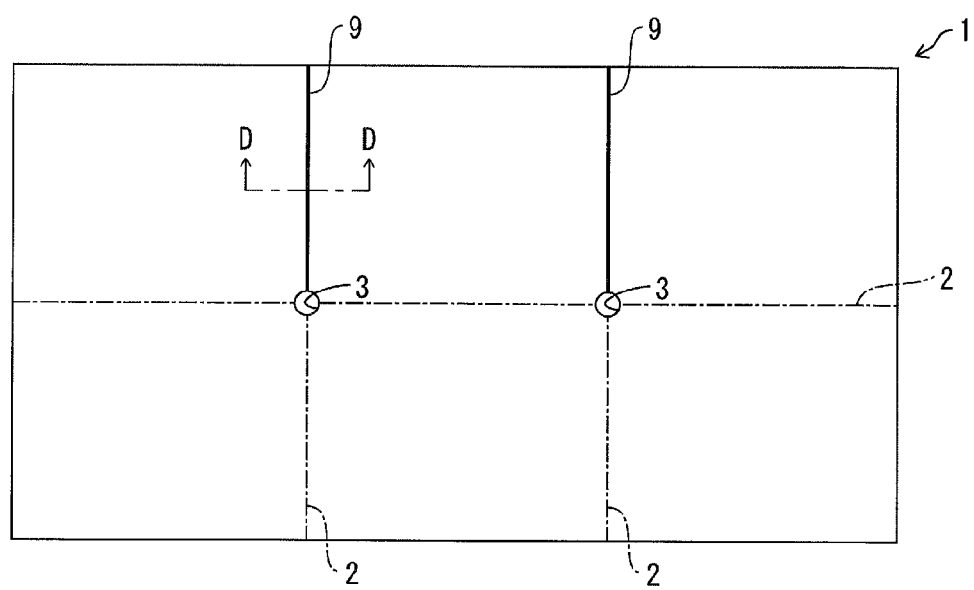
FIG. 18 is a plan view illustrating a schematic configuration of a flexible display in an expanded state according to a third embodiment of the disclosure.

FIG. 18 is a plan view illustrating a schematic configuration of the flexible display 1 in an expanded state according to the present embodiment.

In the flexible display 1 according to the present embodiment, as illustrated in FIG. 18, at least a slit 9 connecting the through hole 3 and one end portion of the bending section 2 positioned at an end portion of the flexible display 1 is provided in some bending sections 2 among the multiple bending sections 2.

The sub pixel 7 is not provided in at least a formation region of the slit 9 in the bending section 2, and the organic film 27 is not provided in the sealing film 25. The flexible display 1 according to the present embodiment and the flexible display 1 according to the first and second embodiments are the same except for the above-mentioned points.

Accordingly, the schematic configuration of the periphery of the through hole 3 in the flexible display 1 illustrated in FIG. 18 is the same as that of FIG. 6A, and an end view of the flexible display 1 illustrated in FIG. 18 when taken along a D-D line is the same as the end view of FIG. 6A except that the slit 9 is provided in place of the through hole 3.

In the example illustrated in FIG. 18, the flexible display 1 is a six-fold display composed of 6 rectangular shapes; two bending sections 2 are provided, in parallel to a short side of the flexible display 1, on a side of a long side of the flexible display 1 to trisect the long side of the flexible display 1, and one bending section 2 is provided, in parallel to the long side of the flexible display 1, on a side of the short side of the flexible display 1 to bisect the short side of the flexible display 1. To rephrase, in the flexible display 1, two bending sections 2 are provided in the lateral direction, and one bending section 2 is provided in the longitudinal direction.

The through holes 3 are provided in each of the fold center portions where the bending sections 2 intersect with each other, and the slits 9 are provided in portions of two bending sections 2 extending in the lateral direction among the multiple bending sections 2; each of the above-mentioned portions of the two bending sections 2 connects the through hole 3 and one end portion of the bending section 2 positioned at an end portion of the flexible display 1.

The width of the slit 9 is not limited to any specific one. The slits 9 may be formed in the grooves 8 illustrated in FIGS. 5A to 5D.

The flexible display 1 may further include a connecting member (not illustrated) configured to connect display units partitioned by the slits 9.

Manufacturing Method for Flexible Display 1

A manufacturing method for the flexible display 1 will be described next.

The flexible display 1 according to the present embodiment can be manufactured by a method similar to the manufacturing method for the flexible display 1 according to the first embodiment, for example, except that the slit 9 is formed, in addition to the through hole 3, in the bending section 2, the TFT 21, the wiring line 22, the edge cover 34, and the organic EL element 24 are disposed so that the sub pixel 7 is formed separate from at least the formation region of the slit 9 in the bending section 2, and the organic film 27 of the sealing film 25 is formed separate from at least the formation region of the slit 9 in the bending section 2, for example.

Figure 19A:
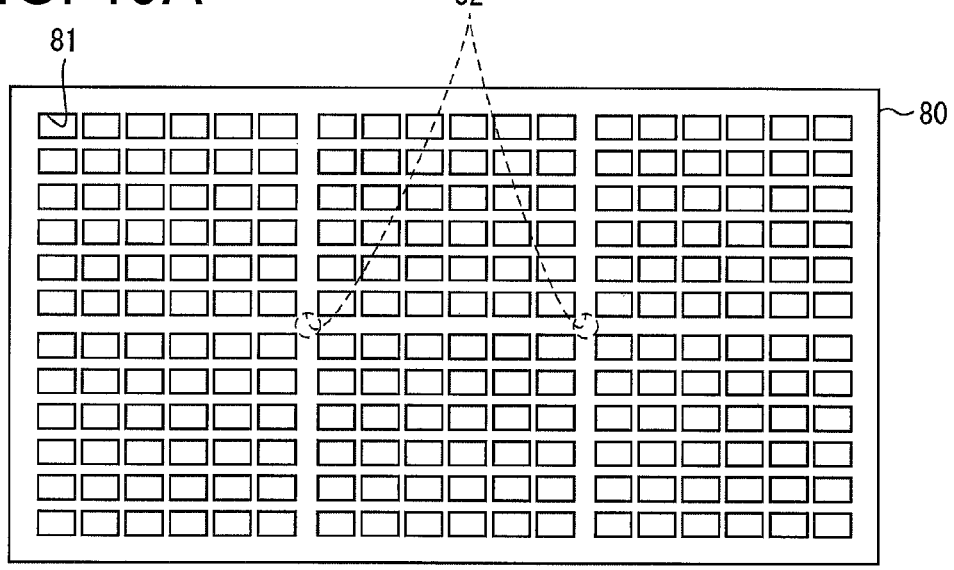
FIG. 19A is a plan view illustrating an example of a schematic configuration of a pattern mask used in manufacturing the flexible display according to the third embodiment of the disclosure.
Figure 19B:
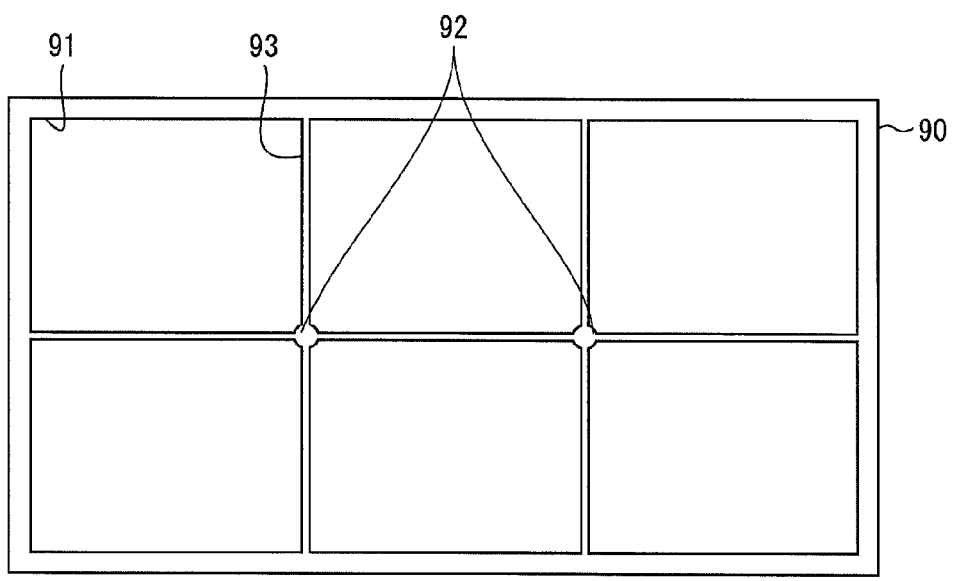
FIG. 19B is a plan view illustrating an example of a schematic configuration of an open mask used in the manufacture of the flexible display according to the third embodiment of the disclosure.

FIG. 19A is a plan view illustrating an example of a schematic configuration of a vapor deposition mask 80 (pattern mask) used in vapor deposition of the light emitting layer in the organic EL layer 32; FIG. 19B is a plan view illustrating an example of a schematic configuration of a vapor deposition mask 90 (open mask) used in vapor deposition of a shared layer, such as the hole transport layer in the second electrode 33 and the organic EL layer 32, shared by the sub pixels 7.

As illustrated in FIG. 19A, the vapor deposition mask 80 used in vapor deposition of the light emitting layer includes multiple openings 81 corresponding to the formation region of the light emitting layer of each sub pixel 7. These openings 81 are formed separate from a region 82 corresponding to the hole opening area 3A of the through hole 3 (for example, see FIG. 8A) and the formation region of the slit 9.

In FIG. 19A, in order to indicate that the opening 81 is formed separate from the hole opening area 3A of the through hole 3 and the formation region of the slit 9, the case in which the opening 81 is formed corresponding to each light emitting layer is cited as an example and illustrated. Note that, for the vapor deposition of the light emitting layer of each light emission color, the vapor deposition mask 80 in which the openings 81 are formed corresponding to the light emission colors is used, for example.

Further, as illustrated in FIG. 19B, the vapor deposition mask 90 used in the vapor deposition of the shared layer includes openings 91 respectively corresponding to the regions divided by the bending sections 2 in the flexible display 1 regardless of presence/absence of the slit 9. In the vapor deposition mask 90, a non-opening region 92 is provided in a region corresponding to the hole opening area 3A of the through hole 3 in the flexible display 1, and a non-opening region 93 serving as a bridging unit connecting the non-opening region 92 and a frame portion of the vapor deposition mask 90 is provided in a region corresponding to the bending section 2 in the flexible display 1 regardless of the presence/absence of the slit 9.

By using the vapor deposition masks 80 and 90, a vapor deposition film is not vapor-deposited on the hole opening area 3A of the through hole 3 and the bending section 2 in the flexible display 1 so that the organic EL layer 32 and the second electrode 33 are not formed.

The description in which the organic EL layer 32 and the second electrode 33 are taken as examples has been given thus far. However, as discussed above, in the case where the sub pixel 7 is not formed in the region corresponding to the bending section 2 in the flexible display 1 but the slit 9 is provided in part of the bending section 2 in the manner discussed above, it is preferable that the TFT 21, the wiring line 22, the flattening film 23, the first electrode 31, the edge cover 34, and also the organic EL layer 32 be formed separate from the bending section 2 and the hole opening area 3A of the through hole 3, regardless of the presence/absence of the slit 9.

Advantageous Effects

According to the present embodiment, as discussed above, because the slit 9 is provided at least in some bending sections 2, among the multiple bending sections 2 each formed to connect the first end portion and the second end portion of the flexible display 1, in part between the first end portion and the second end portion, it is possible to bend the display with ease even in a case where the bending is carried out multiple times, and reduce the plane size of the through hole 3.

At this time, the slits 9 make it possible to bend the display more easily even in the case where the bending is carried out multiple times by at least the slits 9 each formed to connect the through hole 3 and the above one end portion being provided in some bending sections 2 among the multiple bending sections 2.

Further, as discussed above, the flexible display 1 can be bent in directions in which the bending sections 2 intersect with each other. Accordingly, because at least the slits 9 each connecting the through hole 3 and the one end portion are provided in some bending sections 2 among the multiple bending sections 2 as discussed above, the flexible display 1 can be three-dimensionally built to have a three-dimensional shape.

For example, in the example illustrated in FIG. 15, by bending the respective bending sections 2 by 90 degrees so that the display units partitioned by the slits 9 overlap with each other, the display can be formed in a cubic shape with two surfaces open.

Accordingly, for example, by fixing the flexible displays 1 to walls in a room space, display using a huge display device can be performed in which display units are formed on the walls at three sides except a doorway and, for example, on the ceiling; in addition, since the flexible display 1 can become compact by being folded, a display device that can be easily dismantled and carried can be provided.

Further, with a portion where the display units partitioned by the slit 9 overlap each other being a top face or a bottom face, such a multi-purpose display device can be provided that can perform three-way display in a three-way talk, perform display with an expanded large screen, or the like in response to a situation.

The flexible display 1 may further include a reinforcing member for assisting the flexible display 1 in standing by itself, the aforementioned connecting member, or the like.

The reinforcing member and the connecting member may each be provided as a separate body, and may be attached to a face of the flexible display 1 on the opposite side to the display face 1a in a detachable or rotatable manner, for example.

Modification

Figure 20A:
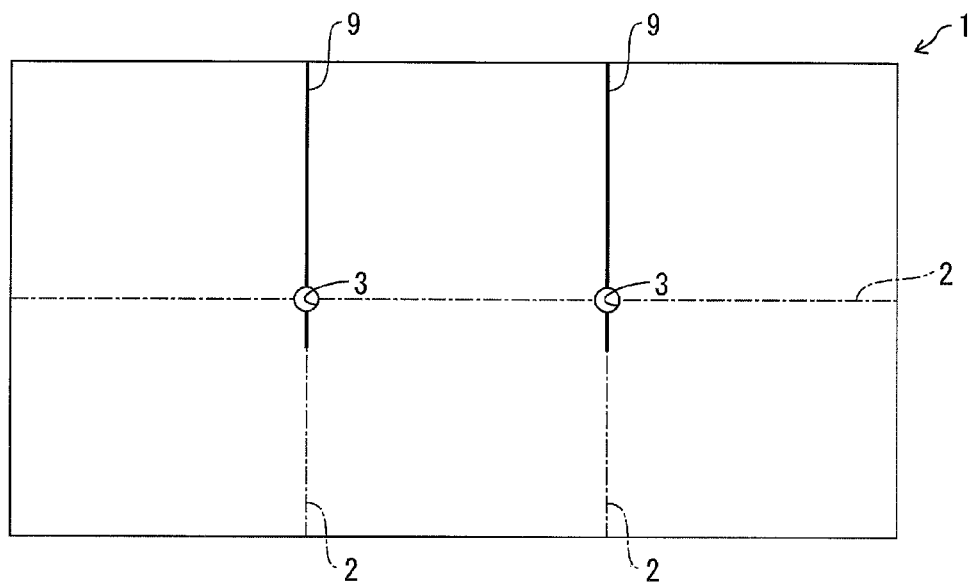
FIGS. 20A and 20B are plan views each illustrating an example of a schematic configuration of a flexible display in an expanded state according to a modification on the third embodiment of the disclosure.
Figure 20B:
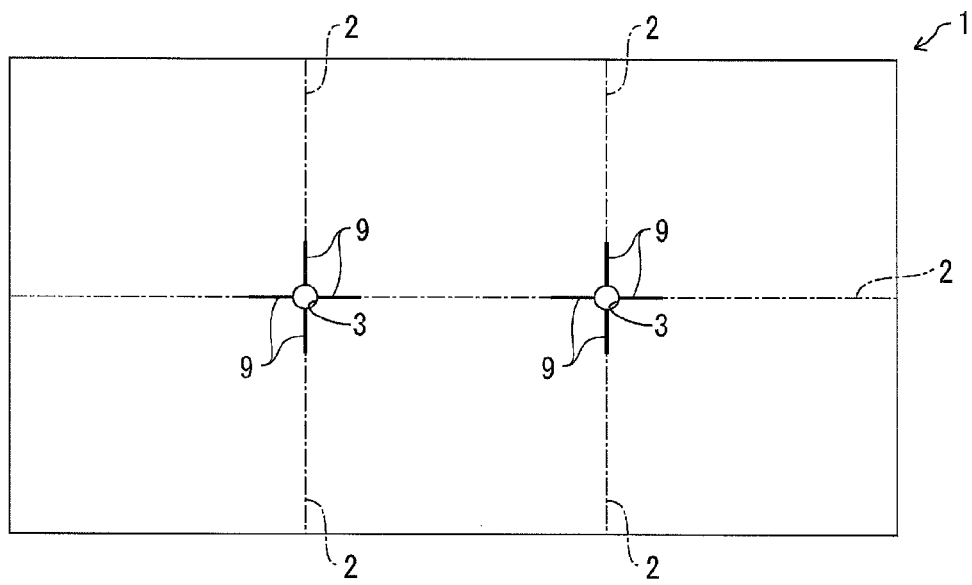

FIGS. 20A and 20B are plan views each illustrating an example of a schematic configuration of the flexible display 1 in an expanded state according to the present modification.

In FIG. 18, the case in which at least the slit 9 connecting the through hole 3 and one end portion of the bending section 2 positioned at an end portion of the flexible display 1 is provided in some bending sections 2 among the multiple bending sections 2 is cited as an example and illustrated. However, the present embodiment is not limited thereto.

As long as the slit 9 is formed at least in some bending sections 2, among the multiple bending sections 2 each formed to connect different end portions of the flexible display 1, in part between one end portion and the other end portion, the slit 9 may be formed extending from the above one end portion to a position beyond the through hole 3, as illustrated in FIG. 20A, or may be formed, as illustrated in FIG. 20B, only in the periphery of the through hole 3.

Although, in FIG. 18 and FIGS. 20A and 20B, the case in which a six-fold display composed of 6 rectangular shapes is cited as an example and illustrated, the present embodiment is not limited thereto.

Supplement

A flexible display 1 according to a first aspect of the disclosure is a flexible display that is flexible and includes multiple bending sections 2 extended in directions intersecting each other; the multiple bending sections 2 each being formed to connect different end portions of the flexible display 1, and a through hole 3 being provided at a fold center portion where the above bending sections 2 intersect each other.

A flexible display 1 according to a second aspect of the disclosure may be such that, in the first aspect, a groove 8 is formed at least in some bending sections 2 among the multiple bending sections 2.

A flexible display 1 according to a third aspect of the disclosure may be such that, in the second aspect, the grooves 8 are each formed to connect one end portion of the flexible display 1 and the through hole 3.

A flexible display 1 according to a fourth aspect of the disclosure may be such that, in any one of the first to third aspects, a slit 9 is formed at least in some bending sections 2, among the multiple bending sections 2, in part between one end portion and the other end portion.

A flexible display 1 according to a fifth aspect of the disclosure may be such that, in the fourth aspect, there are provided multiple electro-optic elements (e.g., organic EL elements 24), and the electro-optic elements are formed separate from the periphery of the through hole 3 and from at least a region of the bending section 2 where the above-mentioned slit 9 is formed.

A flexible display 1 according to a sixth aspect of the disclosure may be such that, in the fifth aspect, the flexible display 1 has a configuration in which the electro-optic element is covered with the sealing film 25; the first inorganic film 26, the organic film 27, and the second inorganic film 28 are layered in that order from the electro-optic element side in the sealing film 25; and the organic film 27 is not formed in the periphery of the through hole 3 and in at least a region of the bending section 2 where the slit 9 is formed.

A flexible display 1 according to a seventh aspect of the disclosure may be such that, in any one of the first to fourth aspects, the flexible display 1 has a configuration in which multiple electro-optic elements (e.g., the organic EL elements 24) are provided; the electro-optic element is covered with the sealing film 25; the first inorganic film 26, the organic film 27, and the second inorganic film 28 are layered in that order from the electro-optic element side in the sealing film 25; and the organic film 27 is not formed in the periphery of the through hole 3.

A flexible display 1 according to an eighth aspect of the disclosure may be such that, in any one of the fifth to seventh aspects, the electro-optic element is an EL element and the flexible display 1 is an EL display device.

A flexible display 1 according to a ninth aspect of the disclosure may be such that, in the eighth aspect, the flexible display 1 has a configuration in which the EL element includes a positive electrode (the first electrode 31), a negative electrode (the second electrode 33), and a functional layer (e.g., the organic EL layer 32) sandwiched and held by the negative and positive electrodes and including at least a light emitting layer; and the negative electrode is not formed in the bending section 2.

A flexible display 1 according to a tenth aspect of the disclosure may be such that, in any one of the first to ninth aspects, the flexible display 1 includes multiple gate wiring lines GL, multiple source wiring lines SL intersecting with the gate wiring lines GL, a gate driver GD configured to supply a signal to the gate wiring line GL, and a source driver SD configured to supply a signal to the source wiring line SL, where at least one of the gate wiring line GL and the source wiring line SL is formed bypassing the through hole 3.

A flexible display 1 according to an eleventh aspect of the disclosure may be such that, in any one of the first to ninth aspects, the flexible display 1 includes multiple gate wiring lines GL, multiple source wiring lines SL intersecting with the gate wiring lines GL, a gate driver GD configured to supply a signal to the gate wiring line GL, and a source driver SD configured to supply a signal to the source wiring line SL; of the multiple gate wiring lines GL, the gate wiring line GL facing the through hole 3 is partitioned with the through hole 3 interposed therebetween, and each part of the partitioned gate wiring line GL with the through hole 3 interposed therebetween may be driven by a different gate driver GD from each other.

A flexible display 1 according to a twelfth aspect of the disclosure may be such that, in the eleventh aspect, of the multiple source wiring lines SL, the source wiring line SL facing the through hole 3 is formed bypassing the through hole 3.

A flexible display 1 according to a thirteenth aspect of the disclosure may be such that, in any one of the first to ninth aspects, the flexible display 1 includes multiple gate wiring lines GL, multiple source wiring lines SL intersecting with the gate wiring lines GL, a gate driver GD configured to supply a signal to the gate wiring line GL, and a source driver SD configured to supply a signal to the source wiring line SL; of the multiple source wiring lines SL, the source wiring line SL facing the through hole 3 is partitioned with the through hole 3 interposed therebetween, and each part of the partitioned source wiring line SL with the through hole 3 interposed therebetween may be driven by a different source driver SD from each other.

A flexible display 1 according to a fourteenth aspect of the disclosure may be such that, in the thirteenth aspect, of the multiple gate wiring lines GL, the gate wiring line GL facing the through hole 3 is formed bypassing the through hole 3.

A flexible display 1 according to a fifteenth aspect of the disclosure may be such that, in any one of the first to ninth aspects, the flexible display 1 includes multiple gate wiring lines GL, multiple source wiring lines SL intersecting with the gate wiring lines GL, a gate driver GD configured to supply a signal to the gate wiring line GL, and a source driver SD configured to supply a signal to the source wiring line SL. Of the multiple gate wiring lines GL, the gate wiring line GL facing the through hole 3 is partitioned with the through hole 3 interposed therebetween, and of the multiple source wiring lines SL, the source wiring line SL facing the through hole 3 is partitioned with the through hole 3 interposed therebetween; each part of the partitioned gate wiring line GL with the through hole 3 interposed therebetween may be driven by a different gate driver GD from each other, and each part of the partitioned source wiring line SL with the through hole 3 interposed therebetween may be driven by a different source driver SD from each other.

A flexible display 1 according to a sixteenth aspect of the disclosure may be such that, in any one of the first to ninth aspects, the flexible display 1 includes multiple gate wiring lines GL, multiple source wiring lines SL intersecting with the gate wiring lines GL, a gate driver GD configured to supply a signal to the gate wiring line GL, and a source driver SD configured to supply a signal to the source wiring line SL. In the flexible display 1, the multiple gate wiring lines GL and the multiple source wiring lines SL are provided in a display region 4; of the multiple source wiring lines SL, the source wiring line SL facing the through hole 3 is partitioned with the through hole 3 interposed therebetween; a non-display region (a frame region 5) formed in a frame shape is provided to surround the above display region 4, and a terminal section TA in which multiple terminals are formed is provided on one side of the above frame-shaped non-display region; and of the multiple source wiring lines SL, the source wiring line SL formed in the display region 4 between the through hole 3 and a side of the frame-shaped non-display region on the opposite side to the side where the terminal section TA is formed, may be distributed to the terminal section TA.

A flexible display 1 according to a seventeenth aspect of the disclosure may be such that, in the sixteenth aspect, the source wiring line SL formed in the display region 4 between the through hole 3 and the side of the frame-shaped non-display region on the opposite side to the side where the terminal section TA is formed, may be distributed in the non-display region to the terminal section TA.

A flexible display 1 according to an eighteenth aspect of the disclosure may be such that, in the sixteenth aspect, the source wiring line SL formed in the display region 4 between the through hole 3 and the side of the frame-shaped non-display region on the opposite side to the side where the terminal section TA is formed, may be drawn to the non-display region and made to return to the display region 4 to be connected to the terminal section TA.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Flexible display
2 Bending section
3, 51 Through hole
4 Display region
5 Frame region (Non-display region)
6 Non-display region
7 Sub pixel
8 Groove
9 Slit
10 Support body
11 Rear-surface film
12 Support film
13, 42 Barrier layer
20 Display circuit layer
24 Organic EL element (Electro-optic element)
25 Sealing film
26 First inorganic film
27 Organic film
28 Second inorganic film
31 First electrode
32 Organic EL layer
33 Second electrode
34 Edge cover
40 Cover body
41 Cover film
42 CF layer
43 BM
50 Button
61, 62 Carrier substrate
71 Dam material
72 Filling material
101 FPC board
GD Gate driver
GL Gate wiring line
SD source driver
SL Source wiring line
TA Terminal section
W, CL Wiring line

The invention claimed is:

1. A flexible display that is flexible and comprises multiple bending sections extended in directions intersecting with each other,
wherein each of the multiple bending sections is formed to connect different end portions of the flexible display,
a through hole is provided at a fold center portion where the bending sections intersect with each other,
the flexible display includes multiple gate wiring lines, multiple source wiring lines intersecting with the gate wiring lines, a gate driver configured to supply a signal to the gate wiring line, and a source driver configured to supply a signal to the source wiring line, and
at least one of the gate wiring line and the source wiring line is formed bypassing the through hole.

2. The flexible display according to claim 1,
wherein a groove is formed at least in some bending sections among the multiple bending sections.

3. The flexible display according to claim 2,
wherein each of the grooves is formed to connect one end portion of the flexible display and the through hole.

4. The flexible display according to claim 1,
wherein a slit is formed in part between one end portion and the other end portion at least in some bending sections among the multiple bending sections.

5. The flexible display according to claim 1, further comprising:
multiple electro-optic elements,
wherein the electro-optic element is covered with a sealing film,
a first inorganic film, an organic film, and a second inorganic film are layered in that order from the electro-optic element side in the sealing film, and
the organic film is not formed in a periphery of the through hole.

6. A flexible display that is flexible and comprises multiple bending sections extended in directions intersecting with each other,
wherein each of the multiple bending sections is formed to connect different end portions of the flexible display,
a through hole is provided at a fold center portion where the bending sections intersect with each other,
the flexible display includes
multiple gate wiring lines, multiple source wiring lines intersecting with the gate wiring lines, a gate driver configured to supply a signal to the gate wiring line, and a source driver configured to supply a signal to the source wiring line,
of the multiple gate wiring lines, the gate wiring line facing the through hole is partitioned with the through hole interposed therebetween, and
each part of the partitioned gate wiring line with the through hole interposed therebetween is driven by a different gate driver from each other.

7. The flexible display according to claim 6,
wherein, of the multiple source wiring lines, the source wiring line facing the through hole is formed bypassing the through hole.

8. The flexible display according to claim 6, further comprising:
multiple gate wiring lines, multiple source wiring lines intersecting with the gate wiring lines, a gate driver configured to supply a signal to the gate wiring line, and a source driver configured to supply a signal to the source wiring line,
wherein, of the multiple source wiring lines, the source wiring line facing the through hole is partitioned with the through hole interposed therebetween, and
each part of the partitioned source wiring line with the through hole interposed therebetween is driven by a different source driver from each other.

9. The flexible display according to claim 8,
wherein, of the multiple gate wiring lines, the gate wiring line facing the through hole is formed bypassing the through hole.

10. The flexible display according to claim 6,
wherein a groove is formed at least in some bending sections among the multiple bending sections.

11. The flexible display according to claim 10,
wherein each of the grooves is formed to connect one end portion of the flexible display and the through hole.

12. The flexible display according to claim 6,
wherein a slit is formed in part between one end portion and the other end portion at least in some bending sections, among the multiple bending sections.

13. The flexible display according to claim 6, further comprising:
multiple electro-optic elements,
wherein the electro-optic element is covered with a sealing film,
a first inorganic film, an organic film, and a second inorganic film are layered in that order from the electro-optic element side in the sealing film, and the organic film is not formed in the periphery of the through hole.

14. A flexible display that is flexible and comprises multiple bending sections extended in directions intersecting with each other,
wherein each of the multiple bending sections is formed to connect different end portions of the flexible display,
a through hole is provided at a fold center portion where the bending sections intersect with each other,
the flexible display includes
multiple gate wiring lines, multiple source wiring lines intersecting with the gate wiring lines, a gate driver configured to supply a signal to the gate wiring line, and a source driver configured to supply a signal to the source wiring line,
the multiple gate wiring lines and the multiple source wiring lines are provided in a display region,
of the multiple source wiring lines, the source wiring line facing the through hole is partitioned with the through hole interposed therebetween,
a non-display region formed in a frame shape is provided to surround the display region, and a terminal section in which multiple terminals are formed is provided on one side of the frame-shaped non-display region, and
of the multiple source wiring lines, the source wiring line formed in the display region between the through hole and a side of the frame-shaped non-display region on the opposite side to the side where the terminal section is formed, is distributed to the terminal section.

15. The flexible display according to claim 14,
wherein the source wiring line formed in the display region between the through hole and the side of the frame-shaped non-display region on the opposite side to the side where the terminal section is formed, is distributed in the non-display region to the terminal section.

16. The flexible display according to claim 14,
wherein the source wiring line formed in the display region between the through hole and the side of the frame-shaped non-display region on the opposite side to the side where the terminal section is formed, is drawn to the non-display region and made to return to the display region to be connected to the terminal section.

17. The flexible display according to claim 14,
wherein a groove is formed at least in some bending sections among the multiple bending sections.

18. The flexible display according to claim 17,
wherein each of the grooves is formed to connect one end portion of the flexible display and the through hole.

19. The flexible display according to claim 14,
wherein a slit is formed in part between one end portion and the other end portion at least in some bending sections among the multiple bending sections.

20. The flexible display according to claim 14, further comprising:
multiple electro-optic elements,
wherein the electro-optic element is covered with a sealing film,
a first inorganic film, an organic film, and a second inorganic film are layered in that order from the electro-optic element side in the sealing film, and
the organic film is not formed in the periphery of the through hole.

* * * * *